United States Patent
Rosenberg et al.

(10) Patent No.: US 11,334,189 B2
(45) Date of Patent: May 17, 2022

(54) SENSOR MODULE AND METHOD FOR DETECTING AND CHARACTERIZING SIDE INPUTS AT DEVICES

(71) Applicant: Sensel, Inc., Sunnyvale, CA (US)

(72) Inventors: Ilya Daniel Rosenberg, Sunnyvale, CA (US); John Aaron Zarraga, Sunnyvale, CA (US); James Junus, Sunnyvale, CA (US); Darren Lochun, Sunnyvale, CA (US); Tomer Moscovich, Sunnyvale, CA (US); Shuangming Li, Sunnyvale, CA (US); Alexander Grau, Sunnyvale, CA (US)

(73) Assignee: Sensel, Inc., Sunnyvale, CA (US)

( * ) Notice: Subject to any disclaimer, the term of this patent is extended or adjusted under 35 U.S.C. 154(b) by 0 days.

(21) Appl. No.: 17/339,857

(22) Filed: Jun. 4, 2021

(65) Prior Publication Data
US 2021/0382598 A1    Dec. 9, 2021

Related U.S. Application Data

(60) Provisional application No. 63/053,071, filed on Jul. 17, 2020, provisional application No. 63/034,798, filed on Jun. 4, 2020.

(51) Int. Cl.
*G06F 3/041* (2006.01)

(52) U.S. Cl.
CPC ............ *G06F 3/04166* (2019.05); *G06F 2203/04105* (2013.01)

(58) Field of Classification Search
None
See application file for complete search history.

(56) References Cited

U.S. PATENT DOCUMENTS

| | | |
|---|---|---|
| 9,146,642 B2 | 9/2015 | Kamano |
| 9,465,477 B2 | 10/2016 | Rosenberg et al. |
| 2010/0328230 A1 | 12/2010 | Faubert et al. |
| 2012/0260220 A1* | 10/2012 | Griffin .................. G06F 3/017 715/863 |
| 2015/0043142 A1 | 2/2015 | Jang et al. |

(Continued)

OTHER PUBLICATIONS

International Search Report Received in PCT/US21/36019 dated Sep. 30, 2021.

*Primary Examiner* — Krishna P Neupane
(74) *Attorney, Agent, or Firm* — Run8 Patent Group, LLC; Peter Miller; Alexander Rodriguez

(57) ABSTRACT

One variation of a system includes: a frame; a sensor module; and a controller. The frame includes: a base structure that locates a display defining a front face of a device; and a lateral frame structure extending along and adjacent an edge of the display and supported on a side of the base structure. The base structure and the lateral frame structure cooperate to define a channel arranged behind the display and extending longitudinally between the lateral frame structure and the side of the base structure. The sensor module is arranged in the channel and includes: a substrate; and a linear array of sensors arranged on the substrate and outputting sense signals representing local deflections of the lateral frame structure. The controller detects locations and force magnitudes of side inputs on the device, proximal the edge of the display, based on sense signals output by the linear array of sensors.

21 Claims, 12 Drawing Sheets

(56) References Cited

U.S. PATENT DOCUMENTS

| | | | |
|---|---|---|---|
| 2019/0179469 A1* | 6/2019 | Quinn | G06F 3/0416 |
| 2020/0042132 A1* | 2/2020 | Kong | G06F 3/0412 |
| 2020/0169625 A1 | 5/2020 | Shim et al. | |

* cited by examiner

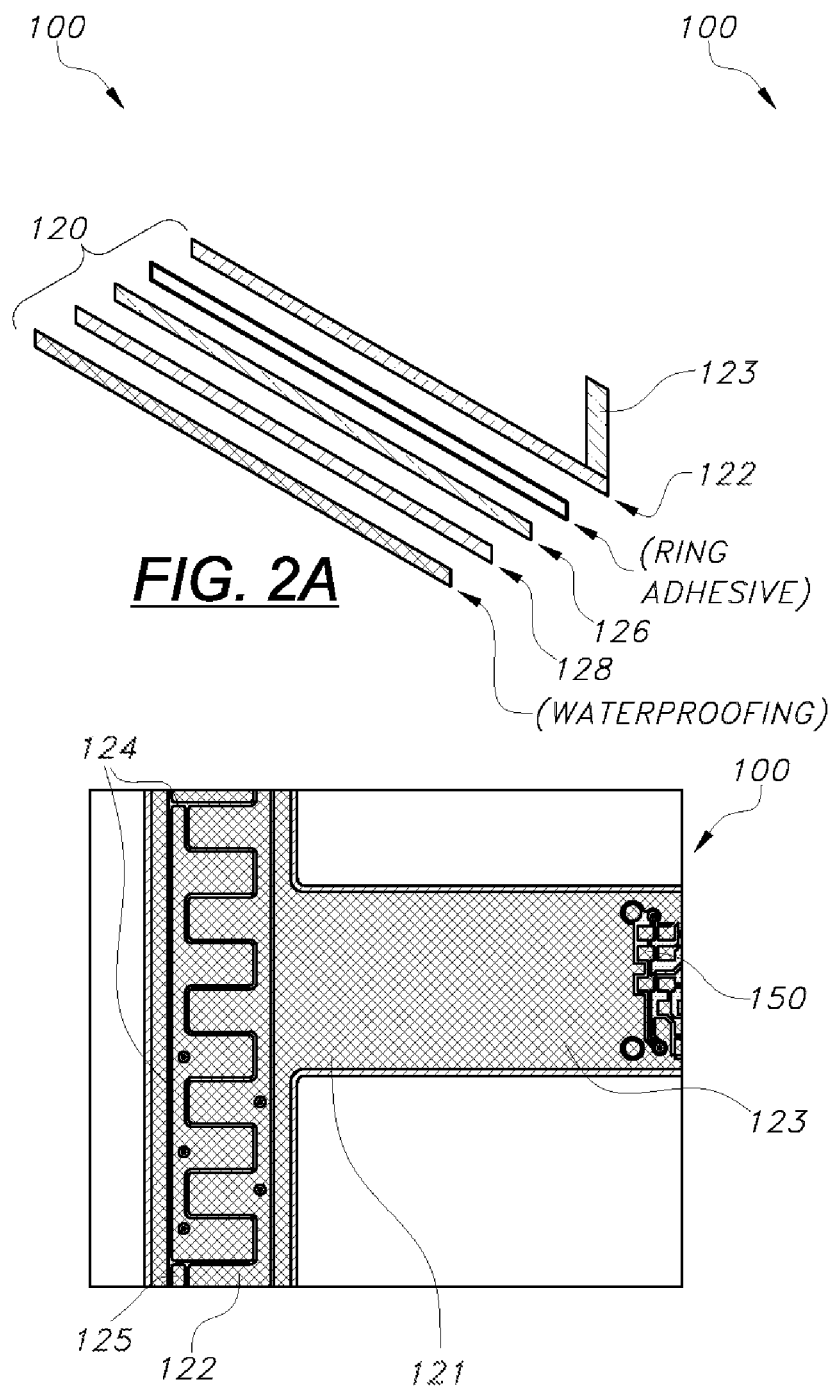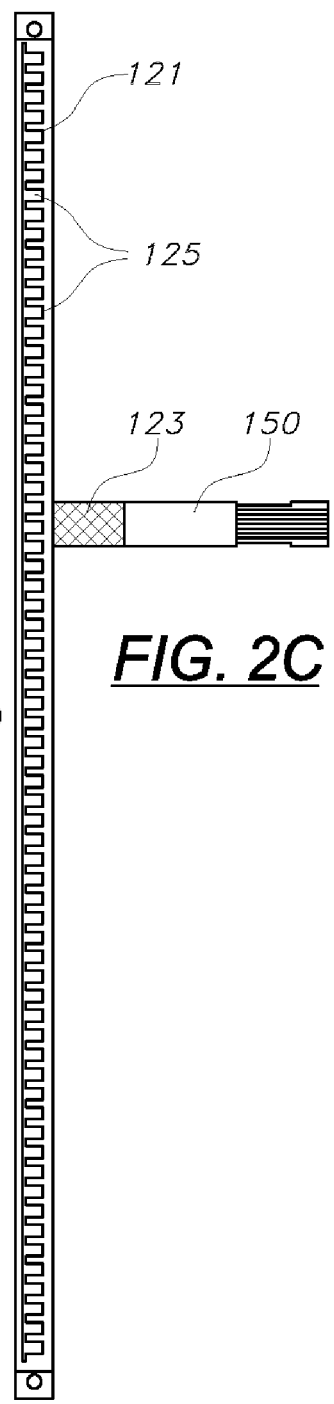
FIG. 2A
FIG. 2B
FIG. 2C

SENSOR MODULE AND METHOD FOR DETECTING AND CHARACTERIZING SIDE INPUTS AT DEVICES

CROSS-REFERENCE TO RELATED APPLICATIONS

This Application claims priority to U.S. Provisional Patent Application No. 63/053,071, filed on 17 Jul. 2020, and 63/034,798, filed on 4 Jun. 2020, each of which is hereby incorporated in its entirety by this reference.

This Application is related to U.S. patent application Ser. No. 14/499,001, filed on 26 Sep. 2014, which is hereby incorporated in its entirety by this reference.

TECHNICAL FIELD

This invention relates generally to the field of touch sensors and more specifically to new and useful systems and methods for detecting and characterizing side inputs at devices in the field of touch sensors.

BRIEF DESCRIPTION OF THE FIGURES

FIGS. 2A, 2B, and 2C are schematic representations of one variation of the system;

DESCRIPTION OF THE EMBODIMENTS

Figure 1:
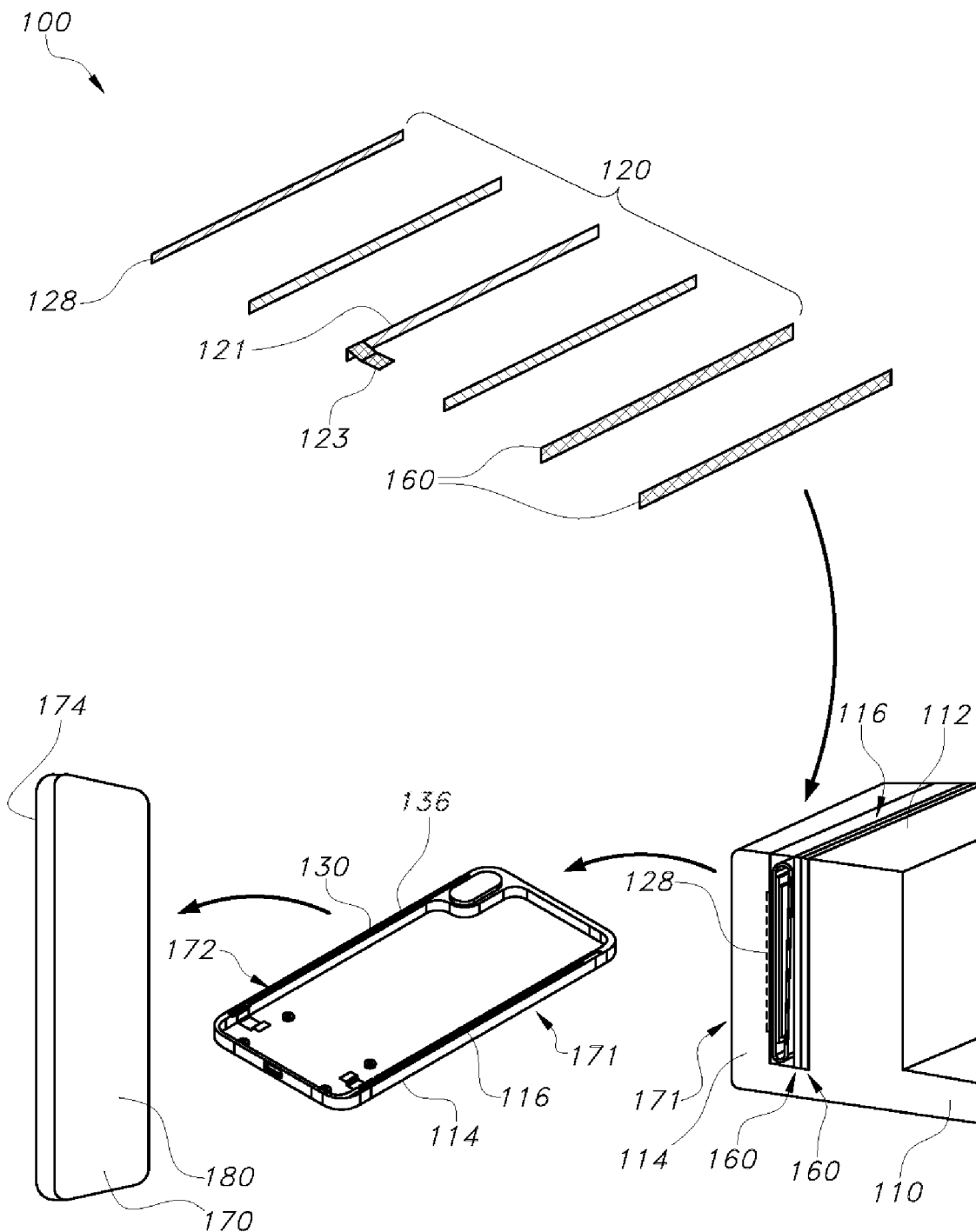
FIG. 1 is a flowchart representation of a system.

The following description of embodiments of the invention is not intended to limit the invention to these embodiments but rather to enable a person skilled in the art to make and use this invention. Variations, configurations, implementations, example implementations, and examples described herein are optional and are not exclusive to the variations, configurations, implementations, example implementations, and examples they describe. The invention described herein can include any and all permutations of these variations, configurations, implementations, example implementations, and examples.

1. System

As shown in FIGS. 1, 11A, 11B, and 11C, a system 100 includes: a frame 110; a sensor module 120; and a controller 150. The frame 110 includes: a base structure 112 configured to locate a display 182 that defines a front face of a mobile computing device; and a lateral frame structure 114 extending along and adjacent a first edge of the display 182 and supported on a first side of the base structure 112. The base structure 112 and the lateral frame structure 114 cooperate to define a channel 116: arranged behind the display 182; and extending longitudinally between the lateral frame structure 114 and the first side of the base structure 112. The sensor module 120 is arranged in the channel 116 and includes: a substrate 121; and a linear array of sensors 124 arranged on the substrate 121 and configured to output sense signals representing local deflections of the lateral frame structure 114. The controller 150 is configured to detect locations and force magnitudes of side inputs on the mobile computing device, proximal the first edge of the display 182, based on sense signals output by the linear array of sensors 124.

2. Applications

Generally, the system 100 can be integrated into a mobile computing device (e.g., a smartphone, a tablet, a laptop computer) to form a continuous pressure sensor along one or more sides of the mobile computing device and thus enable the mobile computing device (hereinafter the "device") to detect both force magnitudes and locations of inputs along the side of the device 170 (hereinafter "side inputs") over a range of force magnitudes and over a (nearly-) continuous range of location. In particular, the system 100 can include: a sensor module 120 arranged behind side of a device 170; and a controller 150 that detects locations and force magnitudes of inputs on the side of the device 170 based on sense signals output by the sensor module 120, dynamically links these side inputs to particular input types based on these input characteristics and/or virtual buttons 188 rendered on a display 182 of the device 170 adjacent the locations of these side inputs, and then triggers context-dependent (e.g., application-specific) command functions at the device 170 based on these input types. For example, the sensor module 120 can be integrated into a side of a device 170 (e.g., in place of mechanical buttons) in order to transform the perimeter of the device 170 into a force-sensitive input surface. The controller 150 (or other processor in the device 170) can then dynamically reassign regions or segments of the side of the device 170 to different input types (e.g., volume control, camera shutter control) based on: a lock screen, home screen, or application open on the device 170; an orientation of the device 170; a last touch location on the side of the device 170; and/or custom settings entered by the user.

2.1 Hardware Assembly and Configuration

More specifically and as shown in FIGS. 2A, 2B, and 2C, the sensor module 120 can include a set of force-sensitive elements—such as a set of drive electrodes and corresponding sense electrodes (hereinafter "drive and sense electrode pairs 125")—arranged on a strip of flexible substrate 121 of length approximating (e.g., within 80% of) the length of a side of the device 170, arranged under a front display of the device 170, located behind a structure defining this side of the device 170 (e.g., a curved section of the display 182, a segment of a frame 110 of the device 170). For example, the sensor module 120 can include: flexible substrate 121 a 250-microns in thickness, 7 millimeters in width, 150 millimeters in length, and populated with a single column of 20 drive and sense electrode pairs 125; and a force-sensitive layer 126 laminated across the column of drive and sense electrode pairs 125 and exhibiting variations in contact resistance against the drive and sense electrode pairs 125 (or variations in local bulk resistance) responsive to local variations in applied force. A channel 116 can be machined, cast, or molded, etc. along and inset from a side of a frame 110 of the device 170 (e.g., along 90% of the length of the side of the frame 110 and inset 1.5 millimeters from the side of the frame 110).

During assembly of the device 170, this preassembled sensor module 120 and an elastic compression element 128 (e.g., a foam insert) can be inserted into the channel 116. A set of shims 160 can then be installed between the sensor module 120 and the channel 116: to compress the compression element 128 (which fills voids and consumes a manufacturing tolerance stack across the channel 116); and to preload the force-sensitive layer 126 against the sensor module 120. More specifically, the compression element 128 can: depress the sensor module 120 against an interior wall of the channel 116; deform to fill voids between the sensor module 120 and the channel 116; absorb inconsistencies and/or manufacturing defects within the channel 116 and on the sensor module 120; exert a pre-load force (i.e., a compressive force) across the sensor module 120 to eliminate gaps between the force-sensitive layer 126 and the drive and sense electrode pairs 125; and thus extend a lower end of the dynamic range of the sensor module 120 along its full length.

As shown in FIG. 1, a planar display can then be installed in the frame 110 to enclose the channel 116 such that an edge of the display 182 terminates proximal (e.g., within 0.5 millimeter of) the side of the frame 110 (i.e., over the lateral frame structure 114 between the channel 116 and the side of the device 170). Accordingly, a section of the lateral frame structure 114 extending along the channel 116 can define a side of the device 170 and can deflect inwardly into the channel 116—and thus compress the force-sensitive layer 126 and modify the contact resistance of the force-sensitive layer 126 against the column of drive and sense electrode pairs 125—responsive to application of a force on the side of the device 170, such as: a user depressing a thumb or forefinger against a region of the side of the device 170 assigned to a virtual volume control or virtual shutter control; or a user squeezing the sides of the device 170 (e.g., to silence an inbound phone call). More specifically, a drive and sense electrode pair can output a sense signal representing contact resistance with an adjacent region of the force-sensitive layer, which changes as a function of contact area of the force-sensitive layer against the drive and sense electrode pair, which changes as a function of applied force. For example, the sense signal output by the sense electrode can represent a sum of many parallel resistances across the local region of the force-sensitive layer in contact with the drive and sense electrode pair.

A controller 150 coupled to the sensor module 120 can thus: read sense signals (e.g., resistance values) from the column of drive and sense electrode pairs 125; interpret force magnitudes carried into each of the drive and sense electrode pairs 125 based on these sense signals, interpret a force gradient along the side of the device 170 based on these force magnitudes, detect locations and force magnitudes of individual inputs along this side of the device 170 based on this force gradient, and/or trigger actions assigned to inputs of these force magnitudes and/or at these locations along the side of the device 170.

Alternatively, a non-planar (i.e., curved) display can be installed over the frame 110 with a curved section of the display 182 extending over and enclosing a side of the frame 110 and the channel 116. Accordingly, the curved section of the display 182 and the frame 110 can collectively deflect inwardly responsive to inputs along the side of the device 170, thereby locally compressing the force-sensitive layer 126, locally changing (e.g., decreasing) the contact resistance between the force-sensitive layer 126 and the column of drive and sense electrode pairs 125, and modifying sense signals output by the drive and sense electrode pairs 125. The controller 150 can then detect and interpret side inputs on the device 170 based on these sense signals.

Figure 9A:
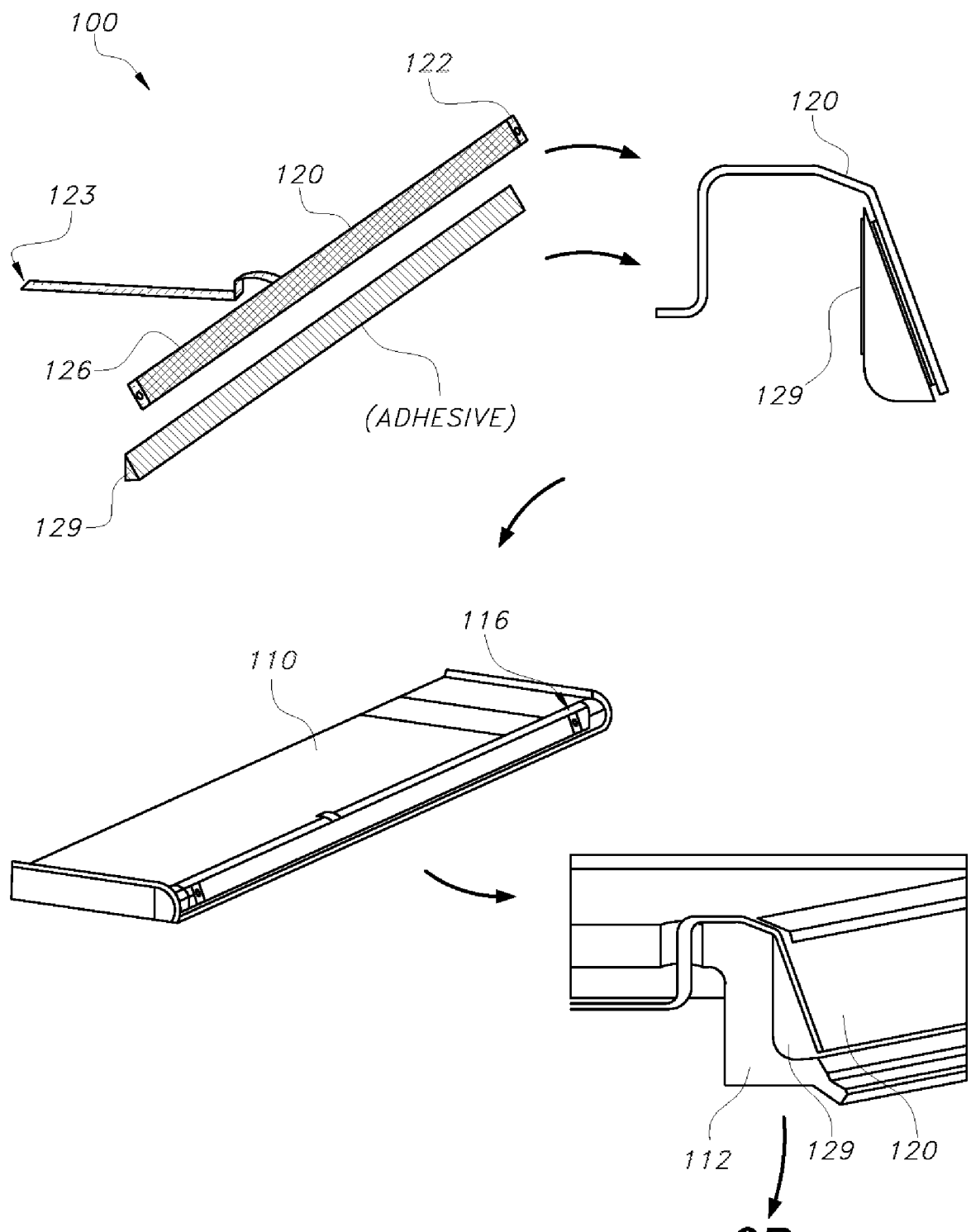
FIGS. 9A and 9B are a flowchart representation of one variation of the system.
Figure 9B:
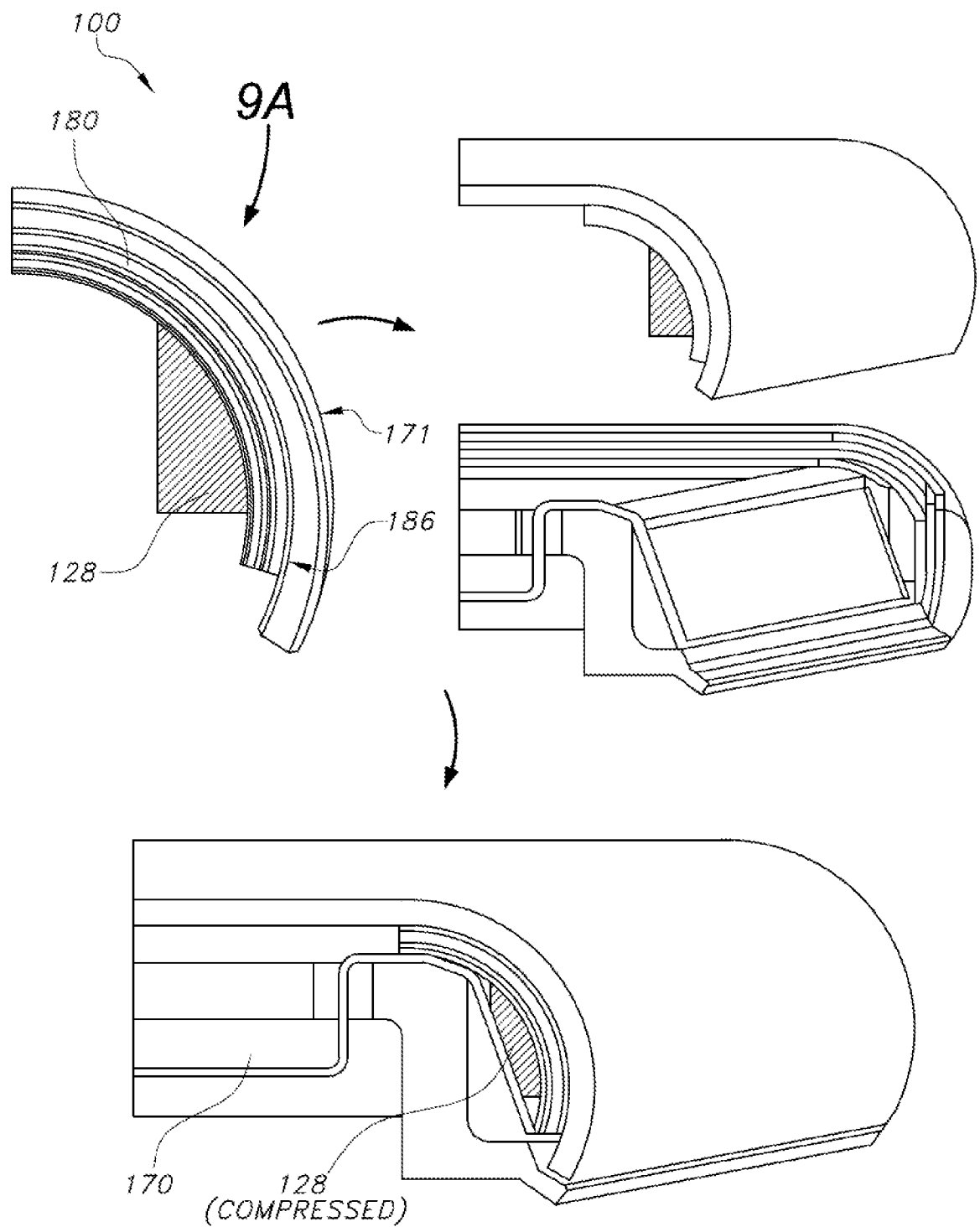

Yet alternatively, a curved section of a non-planar display can cooperate with the frame 110 to define the channel 116 thus occupied by (or "stuffed with") the sensor module 120, as shown in FIGS. 9A and 9B. Accordingly, the curved section 186 of the display 182 deflect inwardly into the channel 116 responsive to inputs along the side of the device 170, thereby locally compressing the force-sensitive layer 126, locally changing (e.g., decreasing) the contact resistance between the force-sensitive layer 126 and the column of drive and sense electrode pairs 125, and modifying sense signals output by the drive and sense electrode pairs 125. The controller 150 can then detect and interpret side inputs on the device 170 based on these sense signals.

2.2 Side Input Detection

In particular, during operation, side inputs into the device 170 can inwardly deflect local regions of the side of the device 170 (e.g., the lateral frame structure 114, a curved section 186 of the display 182), which locally compresses the force-sensitive material, which changes (e.g., decreases) contact resistance across one or more adjacent pairs of drive and sense electrode pairs 125. The controller 150 can thus detect these changes in resistance across these drive and sense electrode pairs 125 and interpret magnitudes of forces carried into the device 170 through these drive and sense electrode pairs 125 as a function of (e.g., proportional to) magnitudes of deviations of sense signals (e.g., magnitudes of changes in voltages or resistances)—read from these drive and sense electrode pairs 125—from corresponding baseline values.

The controller 150 can also: interpolate force magnitudes between these drive and sense electrode pairs 125; calculate a force gradient across the sensor module 120; isolate locations (e.g., centers, centroids) of discrete side inputs; detect side inputs of force magnitudes that exceed threshold forces; interpret sizes (i.e., lengths) of side inputs; etc. based on magnitudes of forces detected at each drive and sense electrode pair 125 in the sensor module 120.

2.3 Virtual Button Reallocation

Furthermore, the controller 150 can: dynamically associate pre-programmed command functions to discrete regions along the side of the device 170; define size (E.g., length) and/or force magnitude thresholds for triggering these functions responsive to side inputs near these discrete regions; and then selectively trigger or execute these command functions based on side inputs interpreted from sense signals read from the sensor module 120.

For example, the controller 150 can characterize a gesture represented by a side input, such as: by matching an instantaneous force gradient captured during a single sensor module 120 scan cycle to a stored force gradient template (e.g., squeezing the side of the device 170 to silence an inbound phone call); or by matching a sequence of force gradients captured during a sequence of scan cycles to a stored force gradient template (e.g., drawing a finger along the side of the device 170 to scroll down a document or webpage). The controller 150 can then execute an action linked to this matched gesture.

Figure 5:
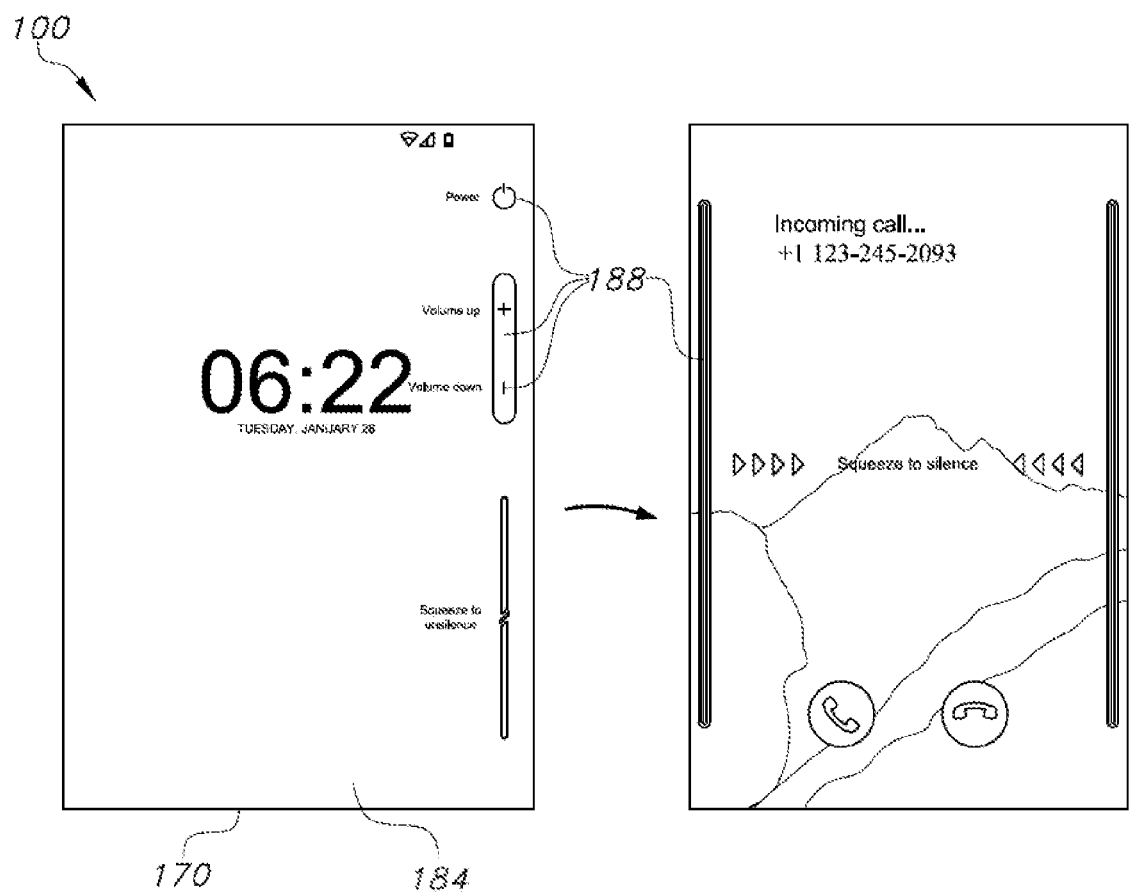
FIG. 5 is a flowchart representation of one variation of the system.
Figure 6:
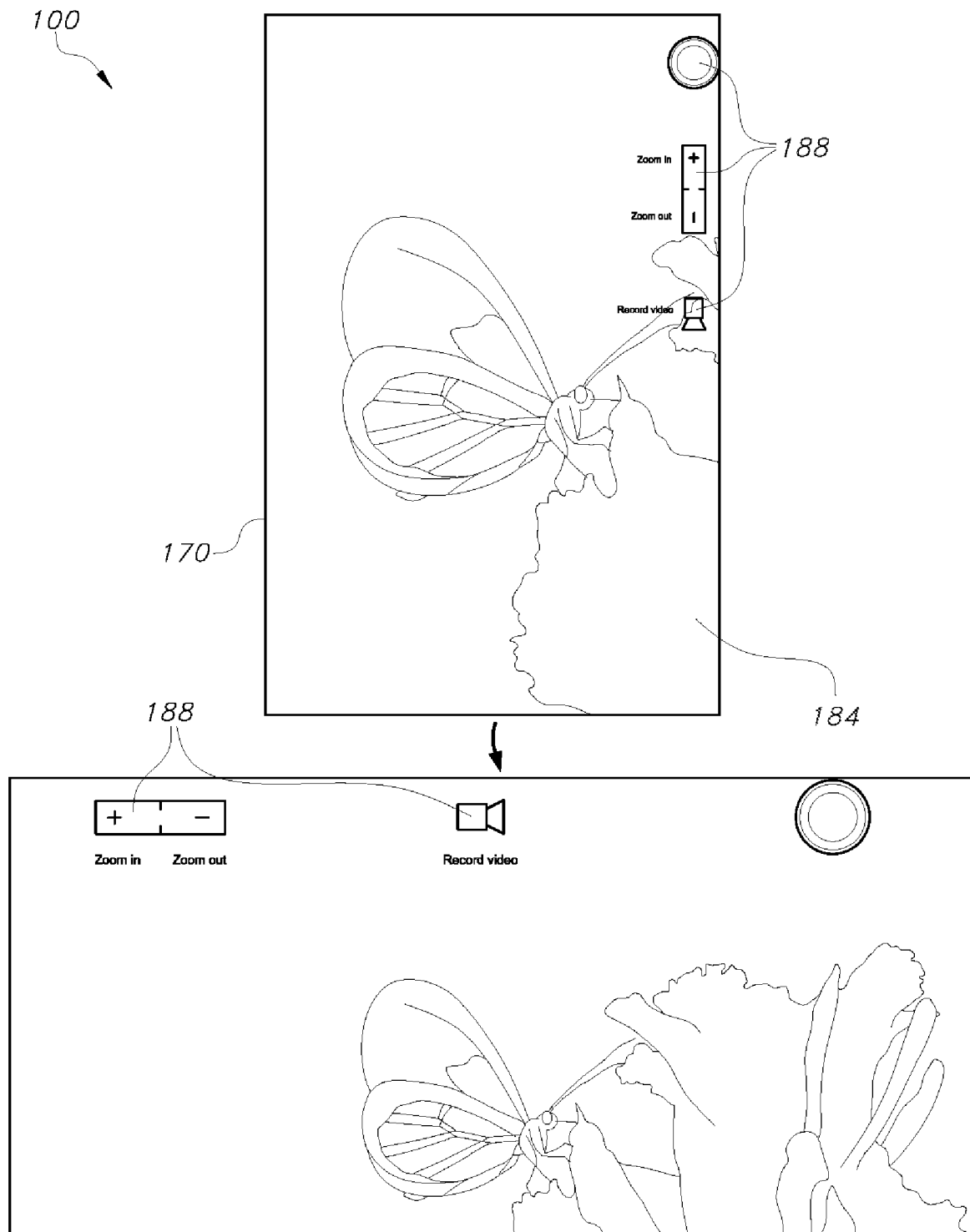
FIG. 6 is a flowchart representation of one variation of the system.

Similarly, the controller 150 can: dynamically remap locations and/or sensing areas on the side of the device 170 to different or additional command functions (e.g., basic commands associated with a lock screen, a home screen, or an application that is currently executing on the device 170); and trigger the display 182 to render icons for these command functions adjacent the current locations and/or sensing areas on the side of the device 170 currently linked to these command functions, as shown in FIGS. 5 and 6. The controller 150 can thus dynamically reallocate particular command functions to different regions along the side of the device 170 in order to seamlessly support a variety of diverse, context-dependent functionalities.

Thus, the sensor module 120 and the controller 150 can: augment and/or replace functionalities of mechanical buttons—such as power-on, volume, scrolling, camera shutter, gaming, and/or video playback controls; and enable dynamic reallocation of regions of the side of the device 170 linked to these functions.

3. Device and Frame

In one implementation shown in FIG. 1, the device 170 (e.g., a mobile phone, a tablet, a smartwatch, a laptop computer) includes: a display 182 (e.g., a flat LCD display or touchscreen 180, a curved OLED display or touchscreen 180); a frame 110 (or a "midframe 110", a chassis) configured to support the display 182 and defining a channel 116 extending along a side (e.g., a left or right lateral side) of the device 170 adjacent and behind an edge of the display 182; a rear cover coupled to the frame 110 opposite the display 182; and a set of electronic components (e.g., a processor, a battery, a wireless communication module, memory, etc.) arranged inside of and supported on the frame 110.

As described below, the frame 110 can include a machined, cast, forged, sintered, and/or molded aluminum, steel, or polymer structure. Furthermore, the perimeter of the frame 110 can be exposed about the perimeter of the display 182 and thus define external, tactile surfaces of the device 170.

In one implementation, the frame 110 includes: a base structure 112 configured to locate the display 182, which defines a front face of the device 170; and a lateral frame structure 114 that extends along and adjacent a first edge of the display 182, is supported on a first side of the base structure 112, and cooperates with the base structure 112 to define a channel 116 arranged behind the display 182 and extending longitudinally between the lateral frame structure 114 and the first side of the base structure 112.

For example, the frame 110 can include a 5-millimeter-thick, 150-millimeter-long unitary machined aluminum structure, including a machined aluminum slot: extending into the frame 110 perpendicular to a front planar face of the display 182; extending longitudinally along a first lateral side of the frame 110 to form the channel 116 that is 140 millimeters in length, 4.5-millimeters in depth, and 1.5 millimeters wide; inset from the first lateral side of the frame 110 to form the lateral frame structure 114 that is 1 millimeter thick, 4.5 millimeters tall, and 140 millimeters long and supported off of the base structure 112 by a 0.5-millimeter-thick web (or "rib") running along the base of the channel 116. The sensor module 120 can then be inserted into this channel 116.

Furthermore, in this example, because a rear edge of the lateral frame structure 114 (e.g., adjacent a rear cover panel 174 of the device 170) is retained and supported by the web, the front edge of the lateral frame structure 114—adjacent the display 182—can preferentially deflect inwardly toward the base structure 112 of the frame 110 to transfer forces input on this side of the device 170 into the sensor module 120, such as to compress a force-sensitive layer 126 against the drive and sense electrode pairs 125 in the sensor module 120 responsive to forces applied to this side of the device 170. For example, the front edge of the lateral frame structure 114—adjacent an edge of the display 182—can be configured to locally deflect inwardly toward the first side of the base structure 112 by a distance between 0.0005 inch and 0.002 inch per pound of force applied to a local section of the side of the mobile computing device. Accordingly, the force-sensitive layer 126 can exhibit local changes in contact resistance inversely proportional to local inward deflection of the front edge of the lateral frame structure 114, which the drive and sense electrode pairs 125 and the controller 150 can detect and interpret as locations and/or force magnitudes of side inputs on the device 170. The thickness of the web can thus be set (or "tuned") to achieve a target rate of deflection of the front edge of the lateral frame structure 114 per unit of force applied to the side of the device 170 in order to achieve a target sensitivity to side inputs on the device 170. Additionally or alternatively, the web can be perforated, as described below, to form a series of bridges along the base of the channel 116, which may reduce resistance to forces applied to the lateral frame structure 114 and thus increase sensitivity of the system 100 to side inputs on the device 170.

4. Sensor Module

The sensor module 120 is arranged in the channel 116 and includes: a substrate 121; and a linear array of sensors 124 arranged on the substrate 121 and configured to output sense signals representing local deflections of the lateral frame structure 114.

In one implementation shown in FIG. 2A, the sensor module 120 includes a force-sensitive layer 126 that faces (e.g., is laminated across) the substrate 121 and that exhibits local changes in contact resistance responsive to local compression against the sensor module 120. Each sensor in the linear array of sensors 124 in the sensor module 120: can include a drive and sense electrode pair 125 facing a region of the force-sensitive layer 126; and can output a sense signal (e.g., a voltage) representing contact resistance of the adjacent region of the force-sensitive layer 126 between the drive and sense electrode pair 125. In particular, the set of drive and sense electrode pairs 125 can be fabricated across or installed on the substrate 121 (e.g., a rigid or flexible PCB). The force-sensitive layer 126: can be arranged over the set of drive and sense electrode pairs 125; can be bonded to the perimeter of the substrate 121; and can include a material that exhibits variations in contact resistance against the drive and sense electrode pairs 125 (or variations in local bulk resistance) as a function of applied force (e.g., local compression).

In the example above in which the frame 110 defines a 140-millimeter-long channel 116 in a 150-millimeter-long device, the sensor module 120 can include a 138-millimeter-long substrate 121 populated with 24 drive and sense electrode pairs 125 and can be arranged in the channel 116 approximately perpendicular to the front planar face of the display 182. A compression element 128 can also be inserted into the channel 116 adjacent the sensor module 120: to fill gaps between the sensor module 120 and walls of the channel 116; and to cooperate with the frame 110 to communicate forces incident on the side of the device 170 (e.g., on the lateral frame structure 114) into local compression of the force-sensitive layer 126 against the sensor module 120, which yields changes in sense signals output by sense electrode pairs near these forces. The controller 150 can then detect locations and/or force magnitudes of inputs on this side of the device 170 based on these sense signal changes.

4.1 Drive and Sense Electrode Pair Arrangement

In one implementation shown in FIG. 2B, the set of drive and sense electrode pairs 125 are arranged in single column extending along the length of substrate 121. In one example, the sensor module 120 includes: 24 rows of 24 drive electrodes arranged in a single column and connected to a single common drive line; and 24 sense electrodes arranged in the single column, each connected to one of 24 sense lines. In this example, during a scan cycle, the controller 150 can selectively drive the single common drive line and serially read a sense signal from each of the 24 sense lines. In another example, the sensor module 120 includes: six clusters of four drive electrodes arranged in one row, wherein each cluster of drive electrodes is connected to one of six common drive lines; and six clusters of four sense electrodes arranged in the row, wherein each cluster of sense electrodes is connected to one of six common sense lines and includes one sense electrode paired with a drive electrode in each of the six cluster of drive electrodes. In this example, during a scan cycle, the controller 150 can: selectively drive the first common drive line and serially read each of the six common sense lines to capture sense signals from the first cluster sense electrodes; selectively drive the second common drive line and serially read each of the six common sense lines to capture sense signals from the second cluster sense electrodes; selectively drive the third common drive line and serially read each of the six common sense lines to capture sense signals from the third cluster sense electrodes; etc.

4.2 Force-Sensitive Layer Arrangement

Figure 3:
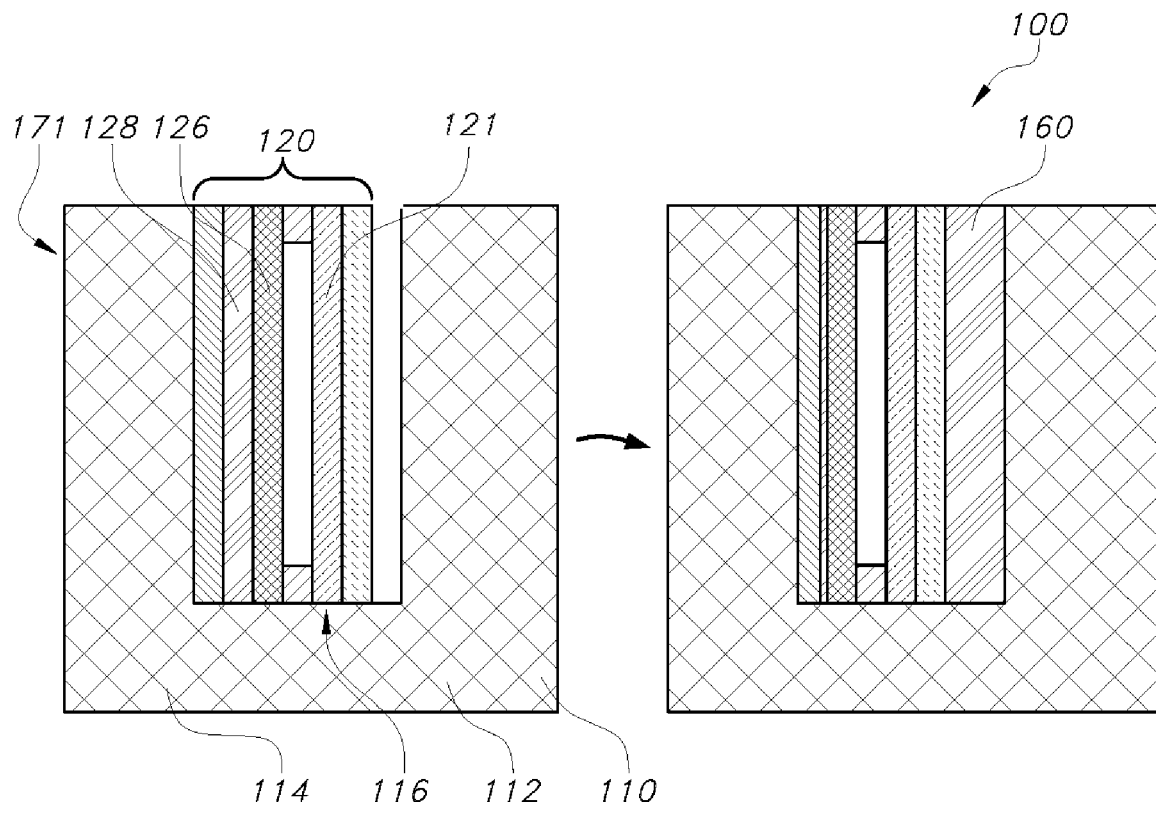
FIG. 3 is a flowchart representation of one variation of the system.

In one implementation shown in FIGS. 2A and 3, the force-sensitive layer 126 is bounded about a perimeter of the substrate 121 with an adhesive (e.g., an annular or "ring" adhesive layer). In this implementation, the adhesive can cover a region of the sensor module 120 and thus reduce sensitivity of the sensor module 120 to forces applied to corners of the device 170 such that the sensor module preferentially detects forces applied squarely to the side of the device. Accordingly, the sensor module may be less sensitive to falsely interpreting a hand holding the device 170 as an input into the side of the device.

In another implementation shown in FIG. 1, the force-sensitive layer 126 is wrapped around the substrate. In this implementation, the force-sensitive layer 126 also be bonded to the back side of the substrate 121 opposite the sensors 124 such that the force-sensitive layer faces and is exposed to the full height and width of the sensors 124 on the front side of the substrate 110. Accordingly, in this implementation, the sensor module may exhibit sensitivity to both forces applied to corners of the device 170 and forces applied squarely to the side of the device.

4.3 Controller Integration

As shown in FIG. 2C, the controller 150 can be arranged remotely from the set of drive and sense electrode pairs 125. For example, the substrate 121 can include: a (rectangular) sense section 122 configured to insert into the channel 116 in the frame 110 and to extend longitudinally along the side of the device 170; and a "tail" section 123 extending laterally from the sense section 122 and defining a plug configured to insert into a data and power receptacle on a main board of the device 170. In this example, the controller 150 can be mounted to the tail section 123 and can communicate locations and/or force magnitudes of detected side inputs into the device 170 (e.g., a processor on the main board of the device 170 via the plug such that the sensor module 120 and the controller 150 define a singular structure configure to install simply in the device 170 (i.e., by inserting the sense section 122 into the channel 116, loading a compression element 128 and a set of shim 160 into the channel 116, and then connecting the tail section 123 to a receptacle on a main board of the device 170).

Therefore, in this variation, the sensor module 120 and the controller 150 can be fabricated and/or assembled on a single structure (e.g., a single, unitary flexible PCB) to form a self-contained side-input detection and interpretation subsystem that includes: a sense section 122 configured to install in the channel 116 and retained without adhesives; and tail section 123 configured to insert a receptacle within the device 170 to fully connect the sensor module 120 and the controller 150 to power supply and data input/output terminals within the device 170.

5. Channel Configuration and Bridges

Figure 11A:
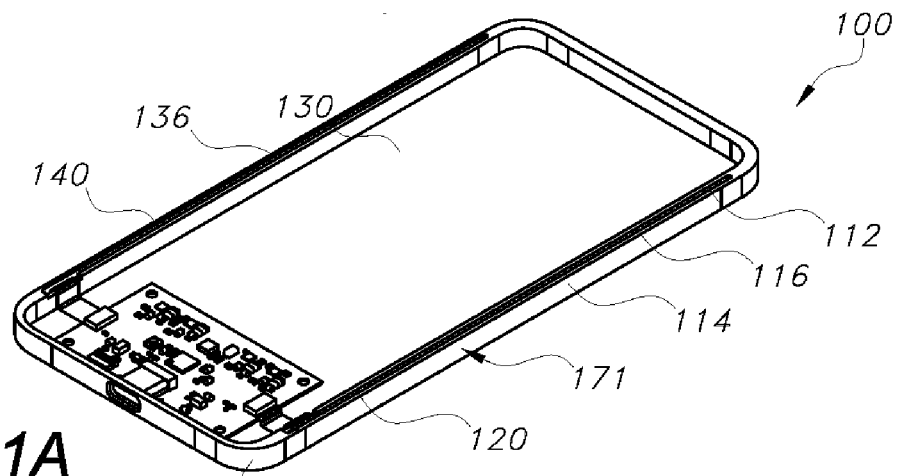
FIGS. 11A, 11B, and 11C are schematic representations of one variation of the system.
Figure 11B:
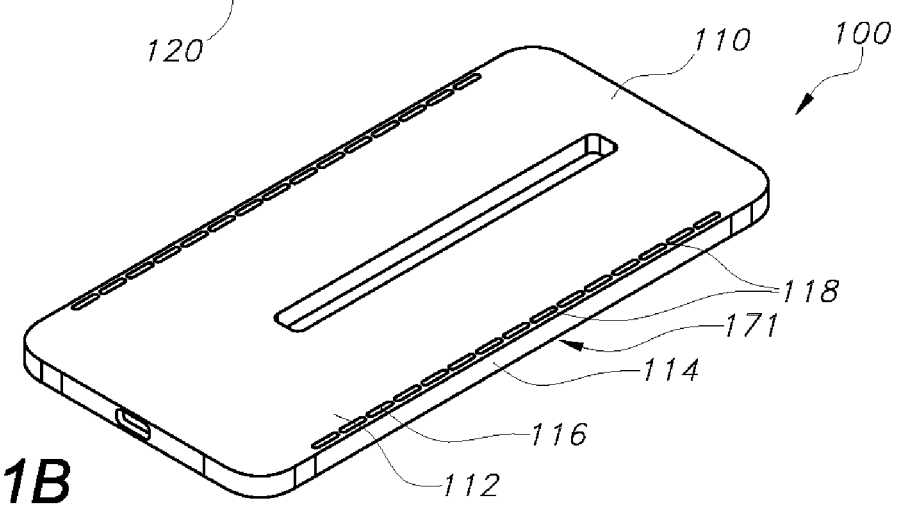
Figure 11C:
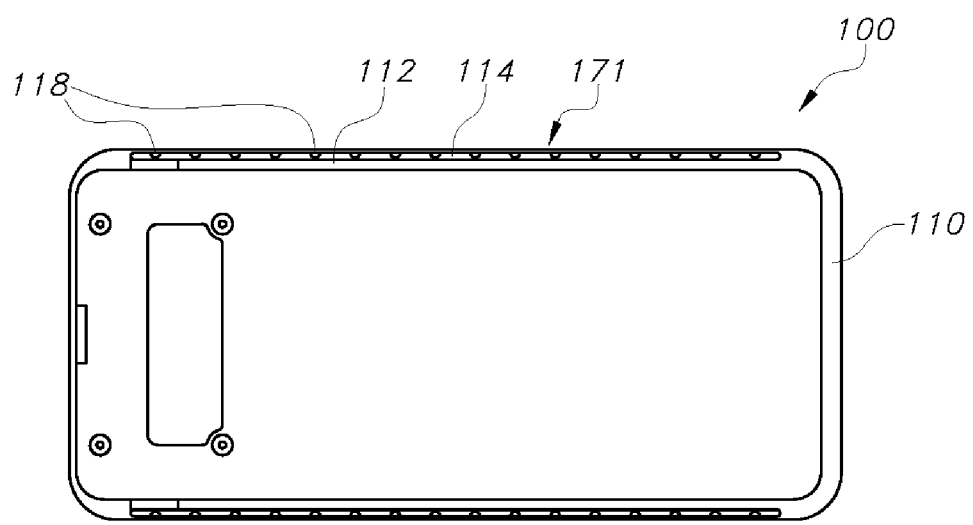

In one variation shown in FIGS. 11A, 11B, and 11C, the frame 110 further defines a series of bridges: extending across the channel 116 from the first side of the base structure 112 to the lateral frame structure 114; longitudinally offset along the channel 116; and configured to locate a rear edge of the lateral frame structure 114 on the base structure 112. More specifically, rather than a continuous web extending from the base structure 112 of the frame 110 to the lateral frame structure 114, the frame 110 can include discrete, intermittent "bridges" that support and locate the rear edge of the lateral frame structure 114 on the base structure 112. In this variation, each sensor in the sensor module 120: can be longitudinally centered between a pair of adjacent bridges—in this series of bridges—in the channel 116; and can output a sense signal representing local deflection of the adjacent section of the lateral frame structure 114 between this pair of adjacent bridges.

These bridges can thus: enable a front edge of the lateral frame structure 114—adjacent the display 182—to preferentially deflect inwardly toward the base structure 112 responsive to side inputs applied to this side of the mobile computing device; and/or enable greater inward deflection of regions of the lateral frame structure 114 between these bridges per unit force applied to the side of the device 170 over these regions of the lateral frame structure 114. More specifically, the bridges can exhibit greater yield to per unit force applied to the side of the device 170 such that greater proportions of forces applied to the side of the device 170 are carried into the sensor module 120, which produces greater compression of the force-sensitive layer 126 and thus greater changes in local contact resistance of the force-sensitive layer 126. Accordingly, the sensors can output sense signals exhibiting greater changes in amplitude per unit force applied to the side of the device 170, thereby increasing sensitivity of the system 100.

5.1 Example: Aluminum Frame with Exposed Side Faces

In one example implementation shown in FIG. 1, the frame 110 includes a 5-millimeter-thick aluminum structure with sides that are exposed when the display 182 and rear cover panel 174 are installed on the front and rear of the frame 110, respectively. In this example implementation, the frame 110 is diecast, machined, and/or extruded, etc. to form a 1.5-millimeter-wide, 4-millimeter deep linear, rectangular channel 116—inset by 1 millimeter from a front edge of a first side of the frame 110. A row of elongated slots are then machined or punched through the base of the channel 116 (e.g., a 1-millimeter-thick web) at positions along the length of the channel 116 corresponding to sensing areas of the sensor module 120 to form a row of "bridges" extending across the base of the channel 116 to support the lateral frame structure 114 between these sensing areas.

In another example in which the first side of the frame 110 is 150-millimeters-long, the channel 116 can be 120 millimeters in length (i.e., 80% of the length of the frame 110), including twenty 5-millimeter-long slots machined along the base of the channel 116 through to the rear face of the frame 110 at 6-millimeter pitch distances to form nineteen 1-millimeter-wide "bridges" at 6-millimeter pitch intervals along the base of the channel 116. In this example, the sensor module 120: can be approximately 120 millimeters (e.g., 118 millimeters) in length; can define a row of twenty sense areas—each containing one or a group of drive and sense electrode pairs 125—at 6-millimeter pitch distances along its length; and can be arranged in the channel 116 such that regions of the sensor module 120 between adjacent sense areas face these bridges.

Thus, the row of bridges can resist deflection of the rear edge of this side of the frame 110 when a force is applied to this side of the frame 110 (e.g., when the device 170 is "squeezed") by a user. However, unsupported segments of the side of the frame 110 between two adjacent bridges may deflect (i.e., bend) inwardly when squeezed by the user. A force applied to an unsupported segment of the side of the frame 110 may deflect this unsupported frame 110 segment inwardly toward the adjacent sensing area of the sensor module 120, thereby: transferring (a portion of) this force into the sensor module 120; compressing the force-sensitive material of the sensor module 120; and reducing local bulk resistance of the force-sensitive material. The controller 150 can then: detect this reduction in local bulk resistance of the force-sensitive material in the form of a change in resistance across sense and drive electrodes in this sensing area of the sensor module 120; and transform the magnitude of this change in resistance into a force magnitude of an input at the position of this sensing area along the first side 171 of the device 170.

More specifically, these bridges can function to: consistently locate the rear edge of the first side of the frame 110; maintain a consistent width of the back face of the frame 110; and enable preferential inward elastic deflection of the front edge of the first side of the frame 110 and inward elastic deflection of unsupported segments of the first side of the frame 110 between bridges toward the sensor module 120—thereby enabling the touch senor module and the controller 150 to detect and interpret a force magnitude of an input applied to the first side 171 of the device 170.

Furthermore, the bridges—spanning the base of the channel 116—can reduce sensitivity to inputs along the rear edge of the first side 171 of the device 170 and/or enable higher sensitivity to inputs along the front edge of the first side 171 of the device 170. For example, the device 170 can render virtual icons along the edge of the display 182 adjacent the first edge of the frame 110 to indicate commands or actions (currently) associated with different regions of the first side 171 of the device 170. Upon seeing these virtual icons rendered on the display 182, a user may be inclined to preferentially "squeeze" or depress the first side 171 of the device 170 nearer the front edge of the device 170 to input a command associated with an adjacent virtual icon rendered on the display 182. Thus, because the bridges are arranged along the rear edge of the first side 171 of the device 170, the front edge of the first side of the frame 110 can exhibit a lower spring constant than the rear edge of the first side of the frame 110 such that the former deflects more under an applied force and such that more of this applied force is transferred into and detected by the sensor module 120.

(Alternatively, to achieve preferential force detection along the rear edge of the first side of the frame 110, the channel 116 can extend forward from the rear face of the frame 110 toward the display 182, and the bridges can be formed along the front face of the frame 110.)

Therefore, in this variation: the base structure 112, the lateral frame structure 114, and the series of bridges can define a unitary structure (e.g., metallic structure); and a base of the channel 116—opposite the display 182—can be perforated to form a series of bridges that support the lateral frame structure 114 off of the base structure 112 of the frame 110.

5.2 Example: Steel Frame

In another example implementation, the frame 110 includes a 5-millimeter-thick stainless steel structure and a rectangular channel 116: machined along the top face of the frame 110; 1.5-millimeter-wide; 4.5-millimeter deep linear; and inset by 0.6 millimeter from the front edge of the first side of the frame 110.

In one example in which the first side of the frame 110 is 150-millimeters-long, the channel 116 can be 120 millimeters in length, including fifteen 7.5-millimeter-long slots machined along the base of the channel 116 through to the back face of the frame 110 at 8-millimeter pitch distances to form fourteen 0.5-millimeter-wide "bridges" at 8-millimeter intervals along the base of the channel 116. In this example, the sensor module 120 is approximately 120 millimeters in length, defines a row of twenty sense areas at 6-millimeter pitch distances along its length, and is installed in the channel 116, as described further below.

In particular, by reducing the thickness of the unsupported segments of the first side of the frame 110 and reducing the width and thickness of the bridges, the stainless steel frame 110 can exhibit spring constants along the front edge of the first side of the frame 110 and along the unsupported segments of the first side of the frame 110 similar to the aluminum frame 110 described above.

Conversely, by increasing the thickness of the unsupported segments of the first side of the frame 110 and/or increasing the width and thickness of the bridges, a plastic or polymer frame 110 may exhibit spring constants along the front edge of the first side of the frame 110 and along the unsupported segments of first side of the frame 110 similar to the aluminum and stainless steel frames described above.

6. Sensor Module Assembly

In this variation and as described above, the sensor module 120 can include: a substrate 121 (e.g., a flexible PCB); a set of drive and sense electrodes 125 arranged across the substrate 121 (e.g., fabricated on one or more conductive layers of the flexible PCB); a layer of force-sensitive material arranged over the substrate 121 adjacent the set of drive and sense electrodes and exhibiting local changes in bulk resistance as a function of applied force (or pressure); and a compression element 128 (e.g., a foam slip) arranged across the force-sensitive material opposite the substrate 121 and configured to fill a void between the channel 116 and the sensor module 120.

In one implementation, the sensor module 120 also includes a first tapered shim 160 bonded to the substrate 121 opposite the force-sensitive material, such as with a pressure-sensitive adhesive—such that a thick end of the first tapered shim 160 extends along a rear edge of the substrate 121. In this implementation, the sensor module 120 is inserted into the channel 116 in the frame 110 with the rear edge of the substrate 121 and the thick end of the first tapered shim 160 located in the bottom of the channel 116 adjacent the rear face of the frame 110. A second tapered shim 160—similar in geometry to the first tapered shim 160—is then inserted, thin-end first, into the channel 116 between the first tapered shim 160 and the adjacent inner wall of the channel 116, thereby driving the sensor module 120 toward the opposite inner wall of the channel 116 and compressing the compression element 128 to fill voids and geometric inconsistencies along the channel 116.

For example, for a 1.5-millimeter-wide channel 116 described above: the substrate 121 can define a thickness of 0.3 millimeters; the pressure-sensitive material layer can define a thickness of 0.3 millimeters; the compression element 128 can define a thickness of 0.4 millimeters; and the pressure-sensitive adhesive can define a thickness of 0.1 millimeters. Furthermore, the first and second tapered shims 160 can include: thin ends 0.2 millimeters in thickness; and thick ends 0.4 millimeters in thickness. The total uninstalled stack height of these elements is therefore approximately 1.7 millimeters. However, the total installed stack height of these elements—once installed in the channel 116—is 1.5 millimeters, including compression of the compression element 128 from an original thickness of 0.4 millimeters to a nominal final thickness of 0.2 millimeters.

Alternatively, in a similar example shown in FIGS. 1 and 3, the sensor module 120 and the compression element 128 can be installed in the channel 116, and a set of flat or tapered shims 160 (e.g., two 0.3-millimeter-thick shims 160) can then be installed in the channel 116 (e.g., between a face of the channel 116 and the substrate 121 of the sensor module 120) to compress the compression element 128 and to drive the force-sensitive layer 126 in contact with the substrate 121.

A display 182 and rear cover panel 174 can then be bonded and/or sealed against a perimeter of the frame 110—beyond these channels 116 and sensor modules 120—such that these channels 116 and sensor modules 120 fall within the waterproof or water-resistant envelope formed by the frame 110, the display 182, and the rear cover panel 174.

7. Multiple Sensor Modules Per Side of Device

In one variation, the system 100 includes: a front channel 116 formed along the front face of the frame 110 adjacent the first side of the frame 110; a rear channel 116 formed along the rear face of the frame 110 adjacent the first side of the frame 110 and at a depth similar to the front channel 116 to form a web proximal a mid-plane of the frame 110; a row of through-slots formed along the web to form a row of bridges between the front and rear channels 116; a front sensor module 120 installed in the front channel 116; and a rear sensor module 120 similarly installed in the rear channel 116.

In this variation, a front edge of the lateral frame structure 114 may preferentially deflect inwardly toward the front sensor module 120 when a force is applied near the front edge of this side of the frame 110, which is then preferentially detected by the front sensor module 120. Similarly, a rear edge of the lateral frame structure 114 may preferentially deflect inwardly toward the rear sensor module 120 when a force is applied near the rear edge of this side of the frame 110, which is then preferentially detected by the rear sensor module 120. Therefore, in this variation, the controller 150 can detect and distinguish between forces applied along the front and rear edges of this side of the frame 110 and selectively execute actions according to such front or rear side inputs into the device 170.

For example, the controller 150 can: detect inputs along both the front and rear edges of this side of the device 170 based on sense signals read from sensors in the front and rear sensor modules 120; identify a rear side input at a particular location on this side of the device 170 if the force magnitude detected by a sensor in the rear sensor module 120 at this particular location is greater than the force magnitude detected by the adjacent sensor in the front sensor module 120 at this particular location; and vice versa. The controller 150 can then: read side inputs as a hand or fingers gripping the device 170 and thus ignore these side inputs; and interpret front side inputs as intentional inputs and thus trigger actions responsive to front side inputs. In this example, the controller 150 can thus enable the user to: hold the device 170 without triggering an action; and then trigger a particular action be depressing a section of the front edge of this side of the device 170 near a virtual button 188—associated with this particular action—rendered on the display 182.

8. Sensor Modules on Multiple Sides of Device

Figure 10:
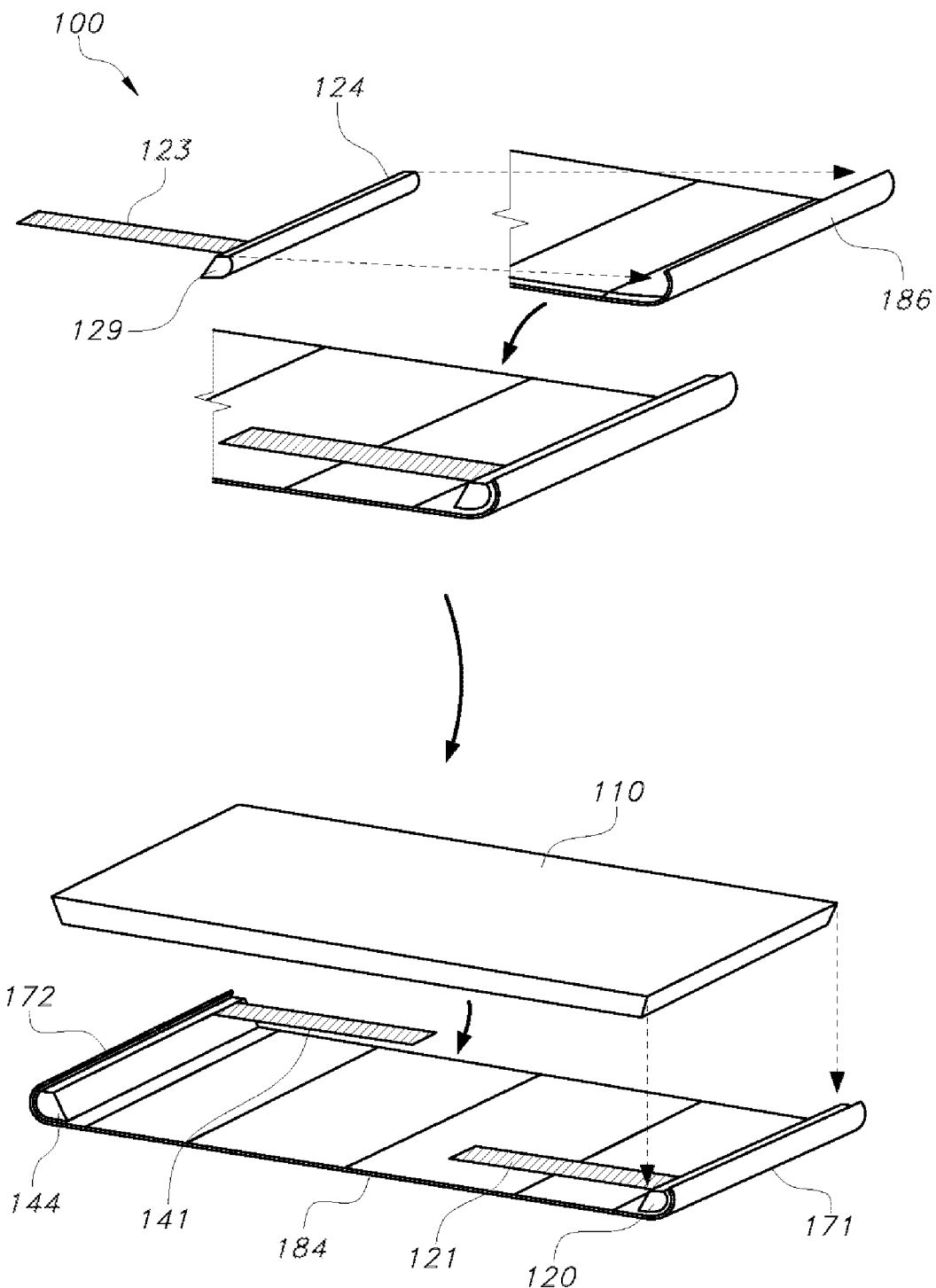
FIG. 10 is a flowchart representation of one variation of the system.

Additionally or alternatively, the device 170 can include channels 116 and sensor modules 120 arranged along additional sides of the frame 110, such as: along the left and right sides of the device 170; or on the left, right, and top sides of the device 170, as shown in FIGS. 1 and 10.

In one implementation, the frame 110 further includes a second outer frame structure 130 (e.g., a second lateral frame structure 114): extending along and adjacent a second edge of the display 182 (e.g., a top side of the device 170); a second lateral side of the device 170 opposite the (first) channel 116 and the (first) sensor module 120; supported on a second side of the base structure 112 of the frame 110; and cooperating with the base structure 112 to define a second channel 136 arranged behind the display 182 and extending between the second outer frame structure 130 and the second side of the base structure 112. In this implementation, the system 100 also includes a second sensor module 140 arranged in the second channel 136 and including: a second substrate 141; and a second linear array of sensors 124 arranged on the second substrate 141 and configured to output sense signals representing local deflections of the second outer frame structure 130.

In this implementation, the controller 150 can be further configured to detect locations and force magnitudes of side inputs on the mobile computing device—proximal the second edge of the display 182—based on sense signals output by the second linear array of sensors 124. More specifically, in this implementation, the controller 150 can sample sense signals from sensors in both sensor modules 120 and interpret locations and force magnitudes of inputs on both of these sides of the device 170 based on these sense signals.

Alternatively, in this implementation, the system 100 can include a second controller 150 coupled to the second sensor module 140 and executing methods and techniques described above and below to detect and interpret force magnitudes of inputs solely on the second side 172 of the device 170 based on sense signals read from sensors in the second sensor module 140.

9. Device Assembly

Once the sensor module 120 is installed in the channel 116 and connected to a master board, the controller 150, and/or another component inside the frame 110 (e.g., via a flexible PCB, as shown in FIGS. 2B and 9B), the display 182 can be installed on the front side of the frame 110 such that edges of the display 182 extend up to (or near) the perimeter of the frame 110 and enclose the channel 116. For example, the perimeter of the display 182 can be bonded to and/or sealed against the perimeter of the frame 110—that is, along the lateral frame structure 114 and outside of the channel 116. In particular, the display 182 can be bonded to the frame 110 along the narrow (e.g., one-millimeter-wide) section of the frame 110 between the channel 116 and the front edge of the first side of the frame 110. Furthermore, in this example, the adhesive or seal that bonds the perimeter of the display 182 to the frame 110 can exhibit compliance in shear in order to: absorb inward deflection of the lateral frame structure 114 when depressed by a user; and limit transfer of this deflection into the edge display, which may otherwise distort an image rendered by the display 182.

A rear cover panel 174 can be similarly bonded to the frame 110 along the narrow (e.g., one-millimeter-wide) lateral frame structure 114 of the frame 110 and can enclose slots between bridges along the base of the channel 116. Thus, the display 182 and the rear cover panel 174 can cooperate to enclose the channel 116 and the sensor module 120, and the channel 116 and the sensor module 120 can fall within a waterproof or water-resistant envelope formed by the frame 110, the display 182, and the rear cover panel 174.

10. Input Detection

Therefore, each sensor, in the linear array of sensors 124 in the sensor module 120, can: face a section of the lateral frame structure 114; and output a sense signal representing local deflection of this section of the lateral frame structure 114. Accordingly, during a scan cycle, the controller 150 can: read a set of sense signals from the linear array of sensors 124; interpret a set of forces applied to sections of the lateral frame structure 114 during the scan cycle based on the set of sense signals; interpolate a particular position of a side input—applied to the mobile computing device proximal the first edge of the display 182 during the scan cycle—based on the set of forces and known positions of these sensors along the channel 116; estimate a total force magnitude of the side input based on a combination of the set of forces; and output the particular position and the force magnitude of the side input, such as to a processor or master controller 150 in the device 170. The controller 150 can also: repeat this process for subsequent scan cycles, such as at a rate of 100 Hz, to detect locations and force magnitudes of side inputs on the device 170 during these subsequent scan cycles; implement input tracking techniques to track side inputs on the device 170 over multiple consecutive scan cycles; and/or detect changes in force magnitudes of individual side inputs; etc.

In one implementation, during operation, the controller 150: reads a set of resistance values across each drive and sense electrode pair 125 in the sensor module 120; transforms these resistance values into a set of force magnitudes, such as based on a stored force-resistance model, scaling function, or lookup table; interpolates between these force magnitudes based on known locations of these sensors in the channel 116; stores these measured and interpolated forces magnitudes in a force gradient that represents the side of the device 170; and detects a set of contiguous regions in the force gradient that exhibit force magnitudes greater than a threshold force. Then, for each of these regions in the force gradient, the controller 150: calculates a total force magnitude of a side input in this region based on a combination (e.g., a sum) of force magnitudes represented in this region of the force gradient; calculates a centroid of this region of the force gradient; and returns (e.g., to a processor in the device 170) a side input at a location of the centroid and of the total force magnitude.

10.1 Input Characterization

The controller 150 can also characterize a side input as: a finger (or an intended input) if the length of the corresponding region of the force gradient is less than a threshold finger length (e.g., 12 millimeters); a thumb if the length of the corresponding region of the force gradient is within a thumb length range (e.g., 12 to 20 millimeters); or a palm if the length of the corresponding region of the force gradient is greater than a threshold palm length (e.g., 12 to 20 millimeters). Additionally or alternatively, the controller 150 can characterize a side input as: a finger (or an intended input) if the peak applied force (or peak applied pressure) within a region of the force gradient associated with this side input exceeds a threshold peak finger force (e.g., 100 grams); a thumb if the peak applied force within a region of the force gradient associated with this side input falls within a thumb force range (e.g., between 25 and 100 grams); or a palm if the peak applied force within a region of the force gradient associated with this side input falls below a threshold peak palm force (e.g., less than 25 grams).

Additionally or alternatively, the controller 150 can isolate a singular side input—in a group of concurrent side inputs into the device 170—most likely to represent an intention selection at the device 170. For example, the controller 150 can identify a particular side input—within a group of concurrent side inputs—at an intentional selection input in response to the particular side input exhibiting greatest peak force or greatest pressure (i.e., total force magnitude divided by total area or length of the input) within the group of side inputs. The controller 150 can then implement methods and techniques described above and below to characterize the particular side input and to return characteristics of the particular side input (e.g., location and/or total force magnitude) to a processor or other subsystem 100 within the device 170.

10.2 Resolution

As shown in FIG. 2B, the sensor module 120 can include drive and sense electrode pairs 125 arranged in a small number of (e.g., one, two) columns and a large number of (e.g., 24, 32) rows. Accordingly, the sensor module 120 can exhibit low resolution to side inputs along the depth of the side of the device 170 and high(er) resolution along the length of the side of the device 170.

In one implementation, the channel 116 and the linear array of sensors 124 extend longitudinally over lengths greater than 80% of the longitudinal length of the first side of the mobile computing device. In this example, the controller 150 can detect locations and force magnitudes of side inputs—within a row of discrete regions on the first side of the mobile computing device—based on sense signals output by the linear array of sensors 124, wherein each discrete region in the row of discrete regions on the first side of the mobile computing device defines a longitudinal length less than 10% of the longitudinal length of the first side of the mobile computing device. For example, a first side 171 of the device 170 can define a length of 150 millimeters; the channel 116 can extend over a length of 140 millimeters along the first side 171 of the device 170; and the sensor module 120 can define a length of 138 millimeters and include 32 drive and sense electrode pairs 125 at a pitch distance of 4.25 millimeters. Accordingly, the controller 150 can detect side inputs at 32 discrete sensible regions along the length of the side of the device 170. The controller 150 can also interpolate forces between these 32 discrete sensible regions (e.g., at one position between adjacent sensible regions) in order to up-sample sense signals read from the sensor module 120.

10.3 Input Tracking and Gesture Interpretation

The controller 150 can also repeat the foregoing process(es) during subsequent scan cycles and interpret particular types of side inputs and/or side input gestures based on side inputs detected over multiple scan cycles.

For example, the controller 150 can characterize a side input as an "intended selection" (or "button press") in response to detecting: a large increase in force magnitude applied at a particular location on the side of the device 170—adjacent a virtual button 188 rendered on the display 182—over a first subset of scan cycles while force magnitudes of side input at other locations on the device 170 remain constant or increase slightly; immediately followed by a decrease in force magnitude applied to the particular location on the side of the device 170 or release of the side input from the particular location over a subsequent sequence of scan cycles. The controller 150 (or a processor in the device 170) can then trigger an action linked to the virtual button 188.

In a similar example, the controller 150 can: implement methods and techniques described above to detect locations and total force magnitudes of individual side inputs on sides of the device 170; and convert these total forces to average pressures based on the total areas (or lengths) of the corresponding side input. In this example, the controller 150 can then characterize a side input as an "intended selection" in response to detecting: a large increase in pressure applied at a particular location on the side of the device 170—adjacent a virtual button 188 rendered on the display 182—over a first subset of scan cycles while pressures of side input at other locations on the device 170 remain constant or increase slightly; immediately followed by a decrease in pressure applied to the particular location on the side of the device 170 or release of the side input from the particular location over a subsequent sequence of scan cycles. The controller 150 (or a processor in the device 170) can then trigger an action linked to the virtual button 188.

In a similar example, the controller 150 can: characterize a side input as an "intended selection" in response to detecting: a large increase in peak applied force (or peak pressure, rather than total force or total pressure) within a particular region of a side input on the side of the device 170 over a first subset of scan cycles while peak applied forces within regions of other side inputs on the side of the device 170 remain constant or increase slightly; immediately followed by a decrease in peak applied force within the particular region over a subsequent sequence of scan cycles.

In another example, the controller 150 can characterize a group of concurrent side inputs as a "squeeze" gesture in response to detecting: an increase in force magnitude applied to a large contiguous area on a first side 171 of the device 170 (e.g., a thumb or palm input); comparable increases in force magnitudes applied to a group of (e.g., three, four) contiguous discrete areas on the opposing side of the device 170 (e.g., three or four fingers); followed by similar and concurrent decreases in force magnitudes of all side inputs in this group.

In yet another example, the sensor module 120 can characterize a side input as a "swipe" or "scroll" gesture in response to detecting: an increase in force magnitude applied to a first location on a side of the device 170 over a first sequence of scan cycles; followed by transition of the side input at a similar force magnitude to a second location on the side of the device 170 over a subsequent sequence of scan cycles. Accordingly, the controller 150 can output a swipe or scroll command at a rate corresponding to the transition rate of the side input from the first location toward the second location.

10.4 Calibration

In one implementation, the controller 150 stores a set of baseline signal values representing contact resistance between the linear array of sensors 124 in the sensor module 120 and the force-sensitive layer 126 during absence of side inputs on the mobile computing device. Then, during a scan cycle, the controller 150: reads a set of sense signals from the linear array of sensors 124; calculates a set of corrected sense signals based on the set of sense signals and the set of baseline signal values (e.g., by subtracting corresponding baseline signal values from these sense signals); interprets a set of nominal forces applied to sections of the lateral frame structure 114 during the scan cycle based on the set of corrected sense signals; and estimates total force magnitudes of side inputs on the mobile computing device—proximal the edge of the display 182 during the scan cycle—based on a combination of the set of corrected forces.

For example, in this implementation, the controller 150 can record (or "tare") baseline electrical (e.g., voltage or resistance) values read from sensors in the sensor module 120 when no force is applied to the sides of the device 170 during a setup period. Then, during an operating period, the controller 150 can: correct or "normalize" sense signals read from drive and sense electrode pairs 125 in the sensor module 120 by subtracting these stored baseline electrical values from sense signals read from corresponding drive and sense electrode pairs 125; and convert these corrected sense signals to force values based on a stored force-resistance model, scaling function, or lookup table, etc.

Alternatively, in this implementation, the controller 150 can: record (or "tare") baseline electrical (e.g., voltage or resistance) values read from sensors in the sensor module 120 when no force is applied to the sides of the device 170 during a setup period; convert these baseline electrical signals to baseline force values based on a stored force-resistance model, scaling function, or lookup table, etc.; and store these baseline force values. Then, during an operating period, the controller 150 can: read sense signals read from drive and sense electrode pairs 125 in the sensor module 120; convert these uncorrected sense signals to uncorrected force values based on the stored force-resistance model, scaling function, or lookup table, etc.; and then subtract the baseline force values from the uncorrected force values to calculate corrected force values along the side of the device 170.

11. Contextual Inputs

The controller 150 (or a separate or master processor in the device 170 can also detect, interpret, and handle side inputs into the device 170 as a function of content rendered on the display 182 (e.g., locations of virtual buttons 188 rendered along the perimeter of the display 182) and/or screens or applications currently executing on the device 170.

For example, while the display 182 renders a lock screen and/or a home screen, the controller 150 can: read sense signals from the sensor module 120; implement methods and techniques described above to detect groups of inputs on both sides of the device 170 and to interpret these inputs as a "squeeze" input; and then trigger the device 170 to transition to a "sleep" or "hibernate" mode responsive to this "squeeze" input. Similarly, while the display 182 is in the "sleep" or "hibernate" mode with the display 182 off, the controller 150 can: read sense signals from the sensor module 120; implement methods and techniques described above to detect groups of inputs on both sides of the device 170 and to interpret these inputs as a "squeeze" input; and then trigger the device 170 to transition to wake and render a lock screen responsive to this "squeeze" input.

In another example, while a camera application is open on the device 170, the controller 150 can: implement methods and techniques described above to detect a group of side inputs on the sides of the device 170; and trigger a shutter function within the camera application in response to at least one of these side inputs spanning a total area or length less than a threshold selection dimension (e.g., a threshold finger area or length) and exhibiting a total force that exceeds a high threshold force (e.g., 165 grams) and then drops below a lower threshold force (e.g., 70 grams). Additionally or alternatively, in this example, the controller 150 can trigger a video capture or image burst function within the camera application in response to at least one of these side inputs spanning a total area or length less than the threshold selection dimension and exhibiting a total force that exceeds a high threshold force (e.g., 165 grams) for more than a threshold duration (e.g., one second).

In yet another example, while a social media application is executing on the device 170, the controller 150 can: implement methods and techniques described above to detect a side input that exceeds a threshold peak force, force magnitude, or pressure; track this side input over multiple scan cycles; detect the side input—at an approximately consistent peak force, force magnitude, or pressure—transitioning downward along the side of the device 170; interpret this side input as a "downward scroll" input; and then trigger the social media application to scroll downwardly through a social feed at a rate proportional to the downward scroll input. Additionally or alternatively, in this example, the controller 150 can: implement methods and techniques described above to detect a group of inputs on two opposing sides of the device 170; interpret a squeeze (or "pinch") gesture input in the device 170 in response to this group of input containing two opposing side inputs of similar sizes and similar force magnitudes exceeding a threshold force magnitude; and then trigger the social media application to scroll downwardly through a social feed at a rate responsive to this squeeze input and proportional to force magnitudes (e.g., the average or total force magnitudes) of these two opposing side inputs.

Therefore, the controller 150 (or other processor in the device 170 can map individual side inputs or groups of concurrent side inputs to different input types based on screens rendered or applications executing on the device 170.

12. Dynamic Button Allocation

As shown in FIGS. 5 and 6, the device 170 can dynamically reassign regions of sides of the device 170 to different command functions, such as based on the current orientation of the device 170, screens currently rendered on the device 170, applications currently executing on the device 170, and/or locations of side inputs detected at the device 170 during a current scan cycle. The device 170 can then render virtual buttons 188—such as in the form of icons and/or text descriptions—of various command functions about the perimeter of the display 182 proximal regions of sides of the device 170 currently assigned to these command functions.

More specifically, based on the current orientation of the device 170, screens currently rendered on the device 170, applications currently executing on the device 170, and/or locations of side inputs detected at the device 170 during a current scan cycle, the device 170 can dynamically: remap associations between regions along the sides of the device 170 and particular command functions; and update iconography rendered on the display 182 to reflect these new side input mappings.

12.1 Example

In one example shown in FIG. 5, while the device 170 display is off, displaying a lock screen, or displaying a home screen, the controller 150 (or other processor in the device 170) can: toggle the device 170 between sleep and locked-screen modes in response to brief side inputs (e.g., a "press" input exceeding a threshold force magnitude for less than two seconds) at a first region of the sensor module 120 (e.g., proximal an upper corner of the device 170); render a virtual "power" button on the display 182 adjacent this first region of the sensor module 120; increase or decrease an output volume of the device 170 in response to brief side inputs or "swipe" inputs within a second region of the sensor module 120 proximal a middle portion of the side of the device 170; render virtual "volume increase" and "volume decrease" buttons on the display 182 adjacent this second region of the sensor module 120; toggle audible notifications (e.g., inbound messages, alarms) in response to side inputs (e.g., a "squeeze" or "pinch" gesture) within a third region of the sensor module 120 proximal a lower portion of the side of the device 170 (e.g., lower half of the device 170); and render a virtual "silence" button on the display 182 adjacent this third region of the sensor module 120.

Later, when a call is inbound to the device 170, the controller 150 (or the processor, etc.) can: remove the virtual "power," volume increase," and "volume decrease" buttons from the display 182; remap the entire length—including the first, second, and third regions—of the sensor module 120 to detecting a "squeeze" input; render a virtual "squeeze to silence" indicator on the display 182; and then selectively silence the inbound call in response to detecting a "squeeze" or "pinch" side input at any position along the length of this sensor module 120.

At a later time, when the user opens a camera application at the device 170 and holds the device 170 in a portrait orientation, the controller 150 (or other processor in the device 170 can automatically: remap the first region of the sensor module 120 to a camera "shutter" control; trigger the camera shutter in response to detecting a side input in the first region of the sensor module 120; remap the second region of the sensor module 120 to "zoom in" and "zoom out" controls; trigger the camera application to zoom a viewfinder in and out in response to detecting side inputs in the second region of the sensor module 120; remap a first subsection of the third region of the sensor module 120 to a "video capture" control; and trigger the camera to record a video in response to detecting a side input in this first subsection of the third region of the sensor module 120; and update the display 182 to render virtual buttons 188 to reflect these remapped controls. Furthermore, the controller 150 (or other processor in the device 170 can: assign a focus force threshold and a shutter force threshold—greater than the focus force threshold—to the first region of "shutter" control; trigger the camera shutter in response to detecting a side input of total force, peak force, or peak pressure exceeding the shutter force threshold in the first region of the sensor module 120; and trigger the camera application to refocus the camera in response to detecting a side input of total force, peak force, or peak pressure between the shutter and focus force thresholds in the first region of the sensor module 120.

Then, if the user rotates the device 170 to a landscape orientation while the camera application is open, the controller 150 (or other processor in the device 170) can automatically: remap the first region of the sensor module 120 to "zoom in" and "zoom out" controls; maintain the "video capture" control mapped to the first subsection of the third region of the sensor module 120; remap the camera "shutter" control to a second subsection of the third region of the sensor module 120 proximal an upper-right corner of the device 170 in the landscape orientation; and update the display 182 to render virtual buttons 188 to reflect these remapped controls.

12.2 Light Input Defines Virtual Button Location

Additionally and/or alternatively, the device 170 can dynamically remap command functions to different regions along the sensor module 120 based on locations of light (i.e., low-force, or "resting") side inputs detected along the side of the device 170.

In one implementation, the controller 150 (or other processor in the device 170): detects a first input of a first force magnitude and at a first location on the first side of the mobile computing device at a first time based on a first set of sense signals read from the array of sensors 124 during a first scan cycle; and triggers the display 182 to render a first virtual button 188 adjacent the first location during a first period of time succeeding the first scan cycle in response to detecting the first input at the first location. The controller 150 then: detects a second input of a second force magnitude and proximal the first location on the first side of the mobile computing device during the first period of time based on a second set of sense signals read from the array of sensors 124 during a second scan cycle succeeding the first scan cycle; and triggers an action affiliated with the first virtual button 188 in response to a) detecting the second input proximal the first location and b) the second force magnitude exceeding the first force magnitude. Later, the controller 150 can: detect a third input at a third location on the second side of the mobile computing device at a third time based on a third set of sense signals read from the second array of sensors 144 during a third scan cycle succeeding the second scan cycle; and trigger the display 182 to render the first virtual button 188 adjacent the third location on the second side 172 of the device 170 during a third period of time succeeding the third scan cycle in response to detecting the third input at the third location on the second side 172 of the device 170.

In one example, during a scan cycle, the controller 150: detects a set of (e.g., three, six) side inputs on the side of the device 170 based on sense signals read from a first sensor module 120 on a first side 171 of the device 170 and a second sensor module 140 on a second side 172 of the device 170; and identifies these side inputs as "resting" side inputs in response to their total force magnitudes, peak force magnitudes, or peak pressures exceeding a threshold force sensitive floor (e.g., 10 grams to filter and discard noise in the sensor module 120) and falling below a side input force threshold (e.g., 165 grams). Alternatively, the controller 150 can identify these side inputs as "resting" side inputs in response to their total force magnitudes, peak force magnitudes, or peak pressures differing by less than a threshold difference (e.g., +/−8%). The controller 150 (or other process in the device 170 can also identify a subset of these side inputs that correspond to individual fingers, such as side inputs characterized by lengths less than a threshold length (e.g., 20 millimeters). Alternatively, the controller 150 can: identify three or more side inputs on first side 171 of the device 170 as fingers with the topmost of these side inputs corresponding to an index finger; identify a largest side input on the second, opposing side of the device 170 as a palm; and identify a second side input on the second side 172 of the device 170 as a thumb.

The controller 150 can then: retrieve a prioritized list of command functions associated with a screen currently rendered on the display 182 or an application currently executing on the device 170; assign a first command function in the prioritized list to a first region of the first sensor module 120 adjacent a topmost side input identified as a finger; update the display 182 to render a first virtual button 188 for the first command function adjacent this first region of a first sensor module 120; assign a second command function in the prioritized list to a second region of the first sensor module 120 adjacent a second side input identified as a finger; update the display 182 to render a second virtual button 188 for the second command function adjacent this second region of the first sensor module 120; etc. The controller 150 can also: reassign a "screen lock" command function to a region of the second sensor module 140 adjacent side input identified as a thumb; and update the display 182 to render a virtual "screen lock" button adjacent this region of the second sensor module 140.

The controller 150 (or other processor in the device 170) can then execute a particular command function in response to detecting a side input—that exceeds a threshold force magnitude (e.g., 165 grams)—in a particular region of the first or second sensor modules 140 currently mapped to this particular command function. The controller 150 can also regularly (e.g., continuously, once per two-second interval) repeat the foregoing process to dynamically reassign command functions to locations along sides of the device 170 adjacent resting side inputs as a user naturally holds the device 170 in her hand, thereby enabling the user to immediately access primary or high-priority functions at the device 170 without moving her fingers along the device 170 or repositioning the device 170 in her hand.

Therefore, the controller 150 (or other processor in the device 170 can dynamically reassign virtual buttons 188 to different locations along a sensor module 120 and dynamically adjust force thresholds for responding to side inputs at these locations.

12.3 Device Orientation Defines Virtual Button Location

In another implementation, the controller 150 can: detect a current orientation of the device 170 based on outputs of an accelerometer on the device 170; rotate a mapping between particular command functions and regions of the sensor module 120(s) by 180° when the device 170 is inverted; and/or rotate a mapping between particular command functions and particular locations by 90° (for a device 170 with sensor modules 120 on all four sides) when the device 170 is transitioned between portrait and landscape orientations.

In a similar implementation in which the device 170 includes two sensor modules 120 on its left and right sides, the controller 150 can assign a first set of virtual buttons 188 to a lower region of the right sensor module 120, a second set of virtual buttons 188 to an upper region of the right sensor module 120, a third set of virtual buttons 188 to an upper region of the left sensor module 120, and a fourth set of virtual buttons 188 to a lower region of the left sensor module 120 when the device 170 is held in the portrait orientation. When the device 170 is transitioned clockwise from the portrait orientation into the landscape orientation, the controller 150 can dynamically reassign the first set of virtual buttons 188 to the lower region of the left sensor module 120, the second set of virtual buttons 188 to the lower region of the right sensor module 120, the third set of virtual buttons 188 to the upper region of the right sensor module 120, and the fourth set of virtual buttons 188 to a upper region of the left sensor module 120. Similarly, when the device 170 is transitioned counter-clockwise from the portrait orientation into the landscape orientation, the controller 150 can dynamically reassign the first set of virtual buttons 188 to the upper region of the right sensor module 120, the second set of virtual buttons 188 to the upper region of the left sensor module 120, the third set of virtual buttons 188 to the lower region of the left sensor module 120, and the fourth set of virtual buttons 188 to a lower region of the right sensor module 120 such that the virtual buttons 188 remain in approximately the same quadrants of the device 170 relative to gravity or a ground plane regardless of orientation of the device 170.

12.4 Handedness

In a similar implementation, the controller 150 can implement methods and techniques described above to detect: a palm and/or a thumb on a first side 171 of the device 170 based on a first set of sense signals read from a first sensor module 120 on this first side 171 of the device 170; and a set of fingers on a second side 172 of the device 170 based on a second set of sense signals read from a second sensor module 140 on this second side 172 of the device 170. The device 170 can then: detect a handedness of a hand holding the device 170 based on positions of the palm, thumb, and/or fingers on sides of the device 170; and selectively reverse (e.g., mirrors) a mapping between command functions and regions of these sensor modules 120 based on the handedness of the hand such that a user's thumb and index finger, etc. can always reach the same virtual buttons 188 (given a particular screen rendered on the display 182 or application executing on the device 170 regardless of whether the user is holding the device 170 with her left hand or right hand.

13. Continuous Input Region+Discrete Button

Figure 4:
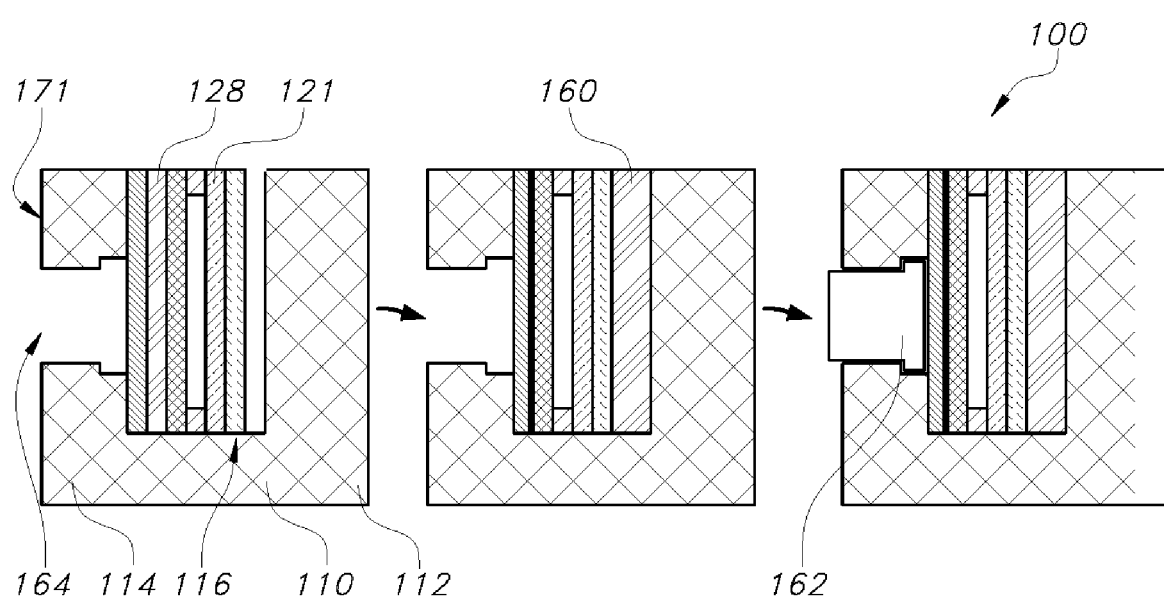
FIG. 4 is a flowchart representation of one variation of the system.

In one variation shown in FIG. 4, the lateral frame structure 114 of the frame 110 defines a bore 164 (e.g., a round or square hole) extending laterally between the first side of the mobile computing device and the channel 116; and the system 100 further includes a physical button element 162 arranged in the bore 164, accessible from the first side of the mobile computing device, and configured to selectively compress a particular region of the force-sensitive layer 126 adjacent a particular sensor in the sensor module 120. In this variation, the wherein the controller 150 can therefore: implement methods and techniques described above to detect locations and force magnitudes of side inputs on the mobile computing device—proximal the first edge of the display 182 and offset from the physical button element 162—based on sense signals output by sensors in the linear array of sensors 124 other than the particular sensor; and detect force magnitudes of inputs on the physical button element 162 based on sense signals output by the particular sensor.

Generally, in this variation, the sensor module 120: can define a singular, continuous substrate 121 and singular, continuous force-sensitive layer 126 arranged in the channel 116 along a side of the device 170; can output sense signals representing inward deflection of the lateral frame structure 114 responsive to inputs along the side of the device 170; and can also output sense signals representing location compression of the force-sensitive layer 126 responsive to depression of a physical button passing laterally through the lateral frame structure 114. For example, the sensor module 120 can be sealed (e.g., waterproofed) against the channel 116 and can detect inputs along the first side 171 of the device 170—from both deflection of the lateral frame structure 114 and depression of the physical button—without additional discrete buttons or seals around these discrete buttons.

14. Sensor Module and Touchscreen Fusion

In one variation in which the device 170 includes a touchscreen 180, the controller 150 (or other processor in the device 170) can: read sense signals from the touchscreen 180 and interpret high-resolution lateral and longitudinal locations on inputs on the touchscreen 180 during a scan cycle based on the sense signals (or access a touch image output by a second controller 150 in the device 170 based on sense signals read from the touchscreen 180); read sense signals from the sensor module 120 arranged along a first side 171 of the device 170 and interpret total force magnitudes (or peak force magnitudes, peak pressures) and low-resolution locations of side inputs along the side of the device 170 during the scan cycle based on sense signals read from the sensor module 120; and identify a touch input detected by the touchscreen 180 as corresponding to a side input detected by the sensor module 120 if the locations of these inputs are within a threshold distance (e.g., if a centroid of the touch input is within 3 millimeters of the edge of the touchscreen 180 on the first side 171 of the device 170). Then upon identifying the touch and side inputs as the same input, the controller 150 can: fuse the high-resolution position of the touch input and the total force magnitude (or peak force magnitude, peak pressure) of the side input into a high-resolution side input; and output this side input (e.g., to another processor in the device 170) during the scan cycle.

More specifically, the touchscreen 180 can include a relatively high density of drive and sense electrode pairs 125 (e.g., one sensor or drive channel 116 per millimeter of length), and the sensor module 120 can include a relatively low density of drive and sense electrode pairs 125 (e.g., one sensor or drive channel 116 per 4.5 millimeters of length). Therefore, the touchscreen 180 can exhibit relatively high spatial resolution, and the sensor module 120 can exhibit relatively low spatial resolution. Thus, in this variation, the controller 150 (or other processor in the device 170 can link a touch input detected at the high-resolution touchscreen 180 and a side input detected at the force-sensitive sensor module 120 during a scan cycle if: the lateral (or "x") position of (the centroid of center of) the touch input falls along the edge of the screen adjacent the sensor module 120 (e.g., within a lateral threshold distance of 3 millimeters from the edge of the touchscreen 180); and the longitudinal (or "y_touch") position of the touch input falls within a threshold longitudinal distance of the longitudinal (or "y_side") position of the side input (e.g., within a longitudinal threshold distance of the pitch distance between sensors in the sensor module 120, or 4.5 millimeters). Then, upon linking these touch and side inputs, the controller 150 can fuse the high-resolution longitudinal position of the touch input detected by the touchscreen 180 and the total force magnitude (or peak force magnitude, peak pressure) of the side input detected by the sensor module 120 into a side input of high(er) spatial resolution.

For example, the touchscreen 180 can include: the display 182; and a touch sensor arranged across the display 182 and configured to output sense signals representing locations of touch inputs over the display 182. In this example, the controller 150 can: read a first set of sense signals from the touch sensor during a scan cycle; detect a first lateral location and a first longitudinal location of a first touch input over the display 182 during the scan cycle based on the first set of sense signals; read a second set of sense signals from the array of sensors 124 in the sensor module 120 during the scan cycle; interpret a first force magnitude of a side input in a first region of a first side of the mobile computing device based on the second set of sense signals; and, in response to the first lateral location of the first touch input falling within a threshold distance of the first region of a first side of the mobile computing device, output a representation of the first side input of the first force magnitude and at the first longitudinal location on the first side of the mobile computing device during the scan cycle.

15. Variation: Curved Display with Exposed Frame

Figure 7:
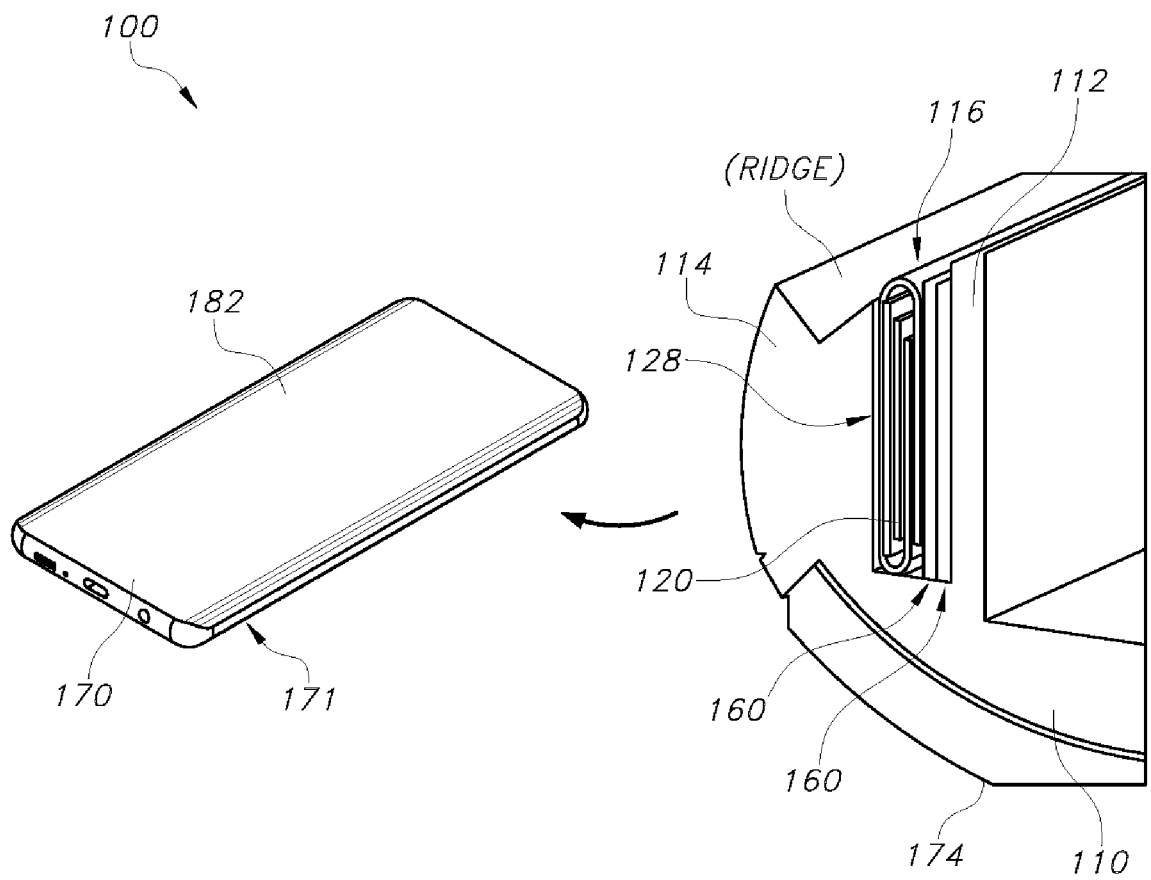
FIG. 7 is a flowchart representation of one variation of the system.

In one variation shown in FIG. 7, the display 182 includes: a planar display section 184 that defines the front face of the mobile computing device; and a non-planar (e.g., curved) display section that extends around a first side of the mobile computing device and defines the first edge of the display 182. In this variation, the lateral frame structure 114 of the device 170 can extend along and behind the non-planar display section 186, and the non-planar display section 186 can extend over and enclose the sensor module 120 in the channel 116. For example, the lateral frame structure 114 can: define a display 182 seat extending along, bonded to, and/or sealed against the first edge of the display 182; and extend past the first edge of the display 182 to define the first side 171 of the device 170. Accordingly, the seat of the lateral frame structure 114 can form a thin (e.g., 0.025") gap along the first edge of the display 182, and the lateral frame structure 114 can deflect inwardly to close this gap and locally compress the force-sensitive layer 126 against sensors in the sensor module 120 responsive to forces applied along the first side 171 of the device 170. Therefore, in this variation, the lateral frame structure 114 can deflect inwardly to locally compress the force-sensitive layer 126 with minimal or no deflection of the first edge of the display 182.

In one example shown in FIG. 7, the frame 110 includes: a first curved (or "radiused") side; a channel 116 and bridges inset from and extending parallel to the first curved side; a front ridge extending along the front of the frame 110 between the channel 116 and the first curved side; and a rear ridge extending along the rear of the frame 110 between the channel 116 and the first curved side. As described above, a sensor module 120 can be loaded into this channel 116. In this example, the device 170 includes: a display 182 (and front cover panel) with a curved "waterfall" edge extending over the front of the frame 110 and the first curved side of the frame 110 and terminating at the front ridge; and a (rigid) rear cover panel 174 with a curved "waterfall" edge extending over the rear of the frame 110 and the first curved side of the frame 110 and terminating at the rear ridge. In particular, the edges of the display 182 (and/or front cover panel) and the rear cover panel 174 can be bonded to the frame 110 adjacent the front and rear ridges, respectively, (e.g., with a flexible waterproof adhesive) with a center section of the first curved side of the frame 110 remaining exposed. Thus, the free edges of the display 182 (and/or front cover panel) and the rear cover panel 174 adjacent the channel 116 can deflect responsive to an applied force on the first side 171 of the device 170 and transfer a portion of this force into the curved side of the frame 110, which also deflects and transfers a portion of this force into an adjacent segment of the sensor module 120. Furthermore, the display 182 (and/or front cover panel) and rear cover panel 174 can be bonded and/or sealed against the perimeter of the frame 110—beyond the channel 116 and the sensor module 120—such that the channel 116 and the sensor module 120 fall within the waterproof or water-resistant envelope formed by the frame 110, the display 182, and the rear cover panel 174.

16. Variation: Curved Display with Concealed Frame

In a similar variation shown in FIG. 8, the channel 116 can extend forward from a rear of the frame 110 toward the display 182; and the non-planar display section 186 can extend around the frame 110 to conceal the lateral frame structure 114 and can define the first side 171 of the device 170 bonded along and/or sealed against the later frame structure. In this variation, the rear cover panel 174 can: similarly extend around the frame 110 to conceal the lateral frame structure 114; abut the first edge of the display 182; and enclose the sensor module 120 in the channel 116. Therefore, in this variation, the first edge of the display 182 can deflect inwardly to communicate the force of a side input into the lateral frame structure 114, which then deflects inwardly to locally compress the force-sensitive layer 126.

Figure 8:
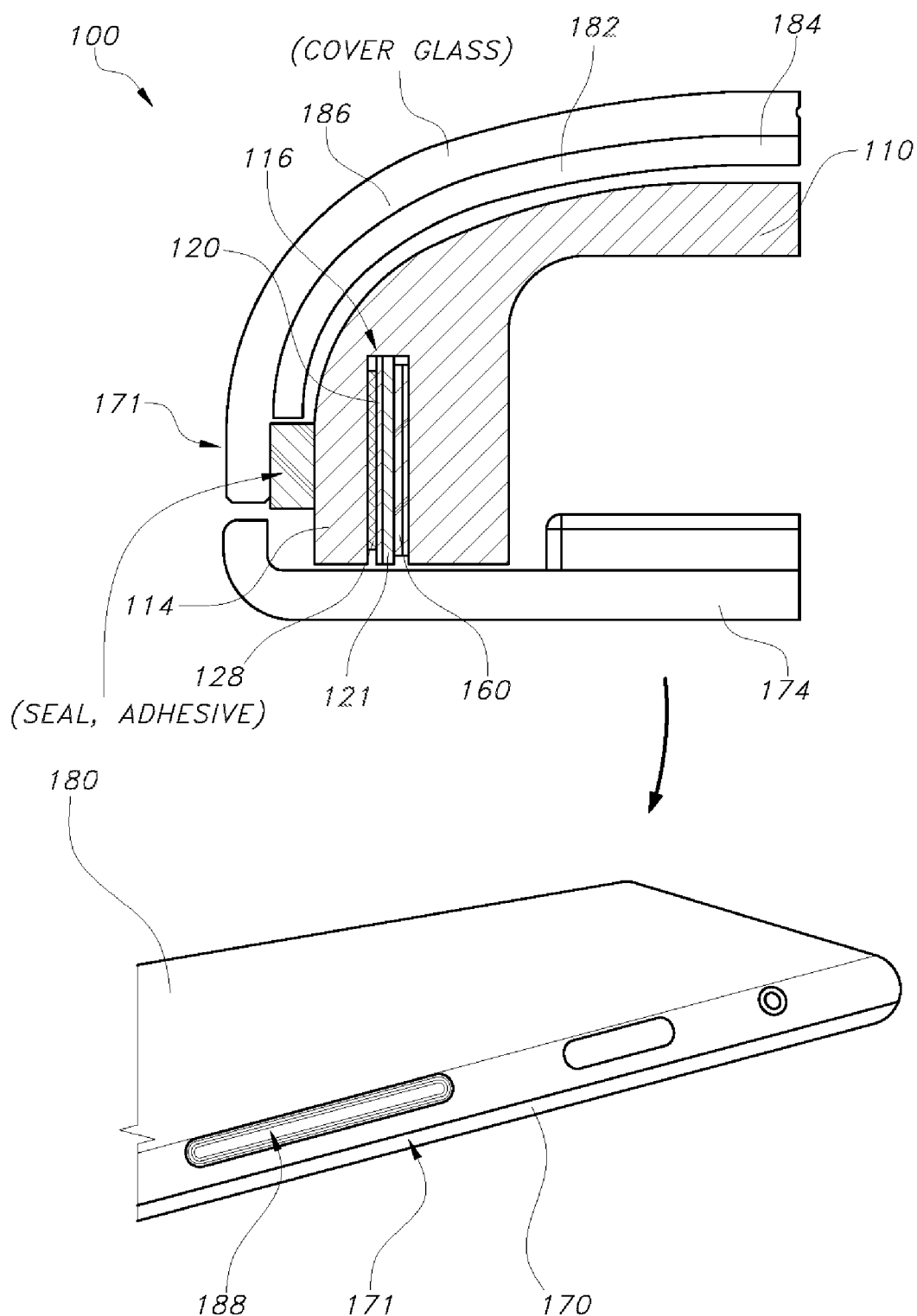
FIG. 8 is a flowchart representation of one variation of the system.

In one example shown in FIG. 8, the device 170 includes: a frame 110 with a first curved (or "radiused") side; a display 182 (and a front cover panel) with a curved "waterfall" edge extending over a front of the frame 110 and the first curved side of the frame 110; and a (rigid) rear cover panel 174 that extends across the rear of the frame 110 and up to the perimeter of the display 182 to enclose and fully obscure the frame 110. As described above, the frame 110 can also include a channel 116 and bridges along the first curved side of the frame 110, and a sensor module 120 can be loaded into this channel 116. In this example, the rear edge of the display 182 (and/or front cover panel) can be bonded to the first curved side of the panel (e.g., with a flexible waterproof adhesive) adjacent the channel 116 and sensor module 120. Thus, the free edge of the display 182 (and/or front cover panel) adjacent the channel 116 can deflect responsive to an applied force on the first side 171 of the device 170 and transfer a portion of this force into the curved side of the frame 110, which also deflects and transfers a portion of this force into an adjacent segment of the sensor module 120.

17. Variation: Curved Display Defining Channel

In another variation in which the display 182 includes a non-planar display section 186 that wraps around an edge of the device 170, the non-planar display section 186 and the frame 110 can cooperate to define the channel 116 and the sensor module 120 can be arranged (e.g., laminated) behind the non-planar display section 186, as shown in FIGS. 9A and 9B.

In one implementation shown in FIGS. 9B and 10: the frame 110 defines a seat extending along its first edge and configured to receive a support base 129 (e.g., a "stiffening element"); and the support base 129 is contoured (e.g., molded, machined) to locate the sensor module 120 parallel to a plane that tangent to a line—centered over the sensor module 120—extending along the non-planar display. During assembly, the sensor module 120—including the force-sensitive layer 126 laminated across the substrate 121—is arranged across and/or bonded to a support base 129, which is then loaded onto the seat. A compression element 128 is installed over the sensor module 120 opposite the support base 129, and the display 182 is then installed onto the frame 110 to enclose the sensor module 120 and compress the compression element 128 between the interior face of the non-planar display section 186 and the sensor module 120, which is rigidly supported on the frame 110 via the support base 129. In this implementation, the frame 110 can also define a lip: extending along the first edge of the display 182 (i.e., along the edge of the non-planar display section 186); and bonded and/or sealed to the first edge of the display 182. For example, the lip can bonded to and/or sealed against the first edge of the display 182 with an adhesive or sealant exhibiting a low modulus of elasticity and that compresses and/or shears to enable the first edge of the display 182 to locally deflect inwardly toward the sensor module 120 and to thus compress the force-sensitive layer 126 responsive to side inputs along the first edge of the display 182.

18. Variation: Capacitive Sensors

Figure 12:
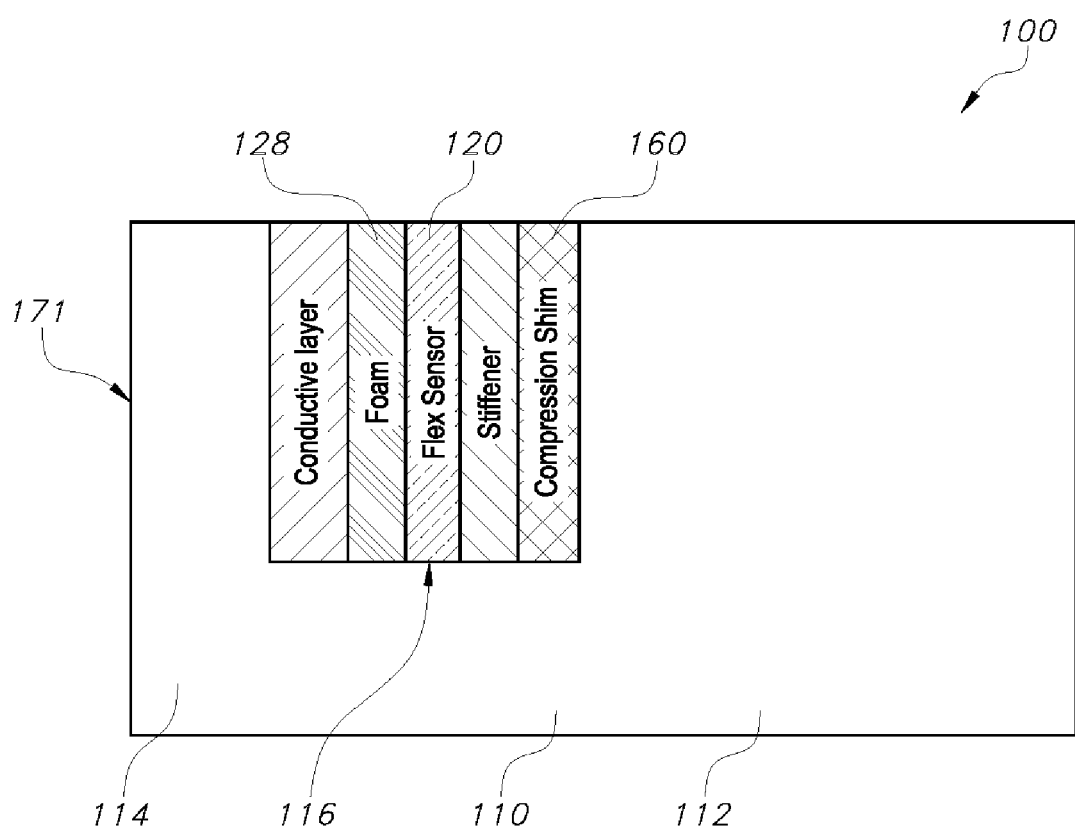
FIG. 12 is a schematic representation of one variation of the system.

In one variation shown in FIG. 12, rather than a force-sensitive layer 126 and sensors configured to detect contact resistance across adjacent regions of the force-sensitive layer 126, the sensor module 120 includes an array of drive and sense electrode pairs 125 arranged in a mutual capacitance configuration and configured to capacitively to a capacitance element along the adjacent side of the device 170. Accordingly, in this variation, the controller 150 is configured to: read capacitance values (e.g., charge time, discharge time, voltage, resonant frequency) from the array of drive and sense electrode pairs 125; and convert these capacitance values into force magnitudes of side inputs adjacent these drive and sense electrode pairs 125.

More specifically, in this variation, a side input applied to the side of the device 170 adjacent a particular drive and sense electrode pair 125 in the sensor module 120 can cause inward deflection of the side of the device 170, which brings the adjacent region of the capacitance element closer to this particular drive and sense electrode pair 125 and changes the capacitance value (e.g., increases charge time, decreases discharge time, decreases voltage) read from the particular drive and sense electrode pair 125. The controller 150 can then read this capacitance value, calculate a difference between this capacitance value and a baseline capacitance value (e.g., recorded when no side input is present on the device 170), and transform this capacitance value into a force magnitude of the side input proximal the particular drive and sense electrode pair 125. The controller 150 can also: execute this process in series or in parallel for each other drive and sense electrode pair 125 in the sensor module 120 to calculate a force magnitude applied to the side of the device 170 during a scan cycle; interpolate force magnitudes between these drive and sense electrode pairs 125; assemble these measured and/or interpolated force magnitudes into a force gradient; and detect locations and total force magnitudes, peak forces, and/or peak pressures of side inputs along the device 170 during this scan cycle, as described above.

In one implementation: the display 182 includes a non-planar display section 186 that wraps around the side of the frame 110 adjacent the sensor module 120 to form all or a portion of a side of the device 170; and the capacitance element includes a conductive trace integrated into and extending near an edge of this non-planar display section 186 such that a force applied to the side of the device 170 inwardly deflects a local region of the edge of the non-planar display section 186, which brings a local section of the conductive trace closer to an adjacent drive and sense electrode pair 125 and thus effects the capacitance of this drive and sense electrode pair 125.

In this implementation, because the non-planar display section 186 is configured to deflect responsive to side inputs into the device 170, because images rendered on the non-planar display section 186 may distort as the display 182 deflects, and/or because the non-planar display section 186 may be sensitive to fatigue and failure as a function of strain, the non-planar display section 186 (and the front edge of the lateral frame structure 114) can be configured to locally deflect inwardly toward the base structure 112 of the frame 110 by a small distance per unit force applied to the side of the device 170, such as by a distance less than 0.0005 inch per pound of force applied to a local section of the side of the device 170. More specifically, because the non-planar display section 186 may be sensitive to local deflection: the lateral frame 110 section can support the edge of the non-planar display section 186 and/or the display 182 can include a rigid (e.g., glass) cover layer configured to support the non-planar display section 186 against inward deflection; and the drive and sense electrode pairs 125 can be tuned to exhibit high sensitivity to small deflections in the adjacent edge of the non-planar display section 186, thereby enabling the controller 150 to detect and interpret side inputs along the non-planar display section 186 despite small deflections of non-planar display section 186 responsive to these side inputs.

In a similar implementation shown in FIG. 12 in which the lateral frame structure 114 is non-metallic, the system 100 includes a compressive element (e.g., a foam strip) arranged between the sensor module 120 and the side of the device 170, such as: between the sensor module 120 and the lateral frame structure 114 for the device 170 in which the lateral frame structure 114 defines the side of the device 170; or between the sensor module 120 and the non-planar display section 186 for the device 170 in which the display 182 wraps around the side of the device 170. In this example, the capacitance element can include a conductive foil (e.g., an aluminum foil) arranged between the compressive element and the side of the device 170 such that a force applied to this side of the device 170 locally inwardly deflects the lateral frame structure 114 and/or the non-planar display section 186, which locally compresses the compression element 128, brings a local section of the conductive foil closer to an adjacent drive and sense electrode pair 125, and thus effects the capacitance of this drive and sense electrode pair 125.

In another implementation, the frame 110 includes the lateral frame structure 114, which: extends along and adjacent a first edge of the display 182; is supported on a first side of the base structure 112 of the frame 110; cooperates with the base structure 112 to define a channel 116 arranged behind the display 182 and extending longitudinally between the lateral frame structure 114 and the first side of the base structure 112; and is configured to locally deflect inwardly toward the base structure 112 responsive to forces applied to the side of the mobile computing device adjacent an edge of the display 182. In this implementation, the sensor module 120 is arranged within the channel 116 along the base structure 112 and offset from an inner face of the lateral frame structure 114 (e.g., by 0.5 millimeter). Furthermore, in this implementation, the frame 110—and therefore the lateral frame structure 114—can include a metallic or conductive material, such as: cast, forged, sintered, or billet aluminum or steel; or co-molded polymer and conductive particulate. Therefore, each sensor (e.g., each drive and sense electrode pair 125) in the linear array of sensors 124 can: capacitively couple to an adjacent section of the lateral frame structure 114; and output a sense signal representing a distance to this adjacent section of the lateral frame structure 114—and therefore representing inward deflection of the adjacent section of the lateral frame structure 114 toward the sensor. More specifically, in this implementation, each sensor in the linear array of sensors 124 can: exhibit capacitive coupling to an adjacent section of the lateral frame structure 114 proportional to inward deflection of the adjacent section of the lateral frame 110; and output a sense signal representing capacitive coupling to the adjacent section of the lateral frame structure 114.

In this variation, the controller 150 can store a set of baseline capacitance values representing nominal distances between the linear array of sensors 124 and adjacent sections of the lateral frame structure 114. Then, during a scan cycle, the controller 150 can: read a set of sense signals from the linear array of sensors 124; calculate a set of corrected sense signals based on the set of sense signals and the set of baseline capacitance values; interpret a set of nominal forces applied to sections of the lateral frame structure 114 during the scan cycle based on the set of corrected sense signals; and estimate a total force magnitude of a side input on the mobile computing device, proximal the first edge of the display 182 during the scan cycle, based on a combination of the set of corrected forces.

Furthermore, in this variation, rather than drive and sense electrode pairs 125 arranged in a mutual capacitance configuration on one side of the substrate 110, the sensor module 120 can: include an array of individual sense electrodes arranged in a self-capacitance configuration across the first side of the substrate 110; and a common ground electrode or individual ground electrodes arranged along the second side of the substrate opposite these sense electrodes. Accordingly, the controller 150 can implement similar methods and techniques to: detect changes in positions of local regions of the side of the device 170 relative to these sense electrodes based on capacitance values read from these sense electrodes; and then interpret force magnitudes and locations of side inputs on the device 170 based on these positional changes.

The systems and methods described herein can be embodied and/or implemented at least in part as a machine configured to receive a computer-readable medium storing computer-readable instructions. The instructions can be executed by computer-executable components integrated with the application, applet, host, server, network, website, communication service, communication interface, hardware/firmware/software elements of a user computer or device, wristband, smartphone, or any suitable combination thereof. Other systems and methods of the embodiment can be embodied and/or implemented at least in part as a machine configured to receive a computer-readable medium storing computer-readable instructions. The instructions can be executed by computer-executable components integrated by computer-executable components integrated with apparatuses and networks of the type described above. The computer-readable medium can be stored on any suitable computer readable media such as RAMs, ROMs, flash memory, EEPROMs, optical devices (CD or DVD), hard drives, floppy drives, or any suitable device. The computer-executable component can be a processor but any suitable dedicated hardware device can (alternatively or additionally) execute the instructions.

As a person skilled in the art will recognize from the previous detailed description and from the figures and claims, modifications and changes can be made to the embodiments of the invention without departing from the scope of this invention as defined in the following claims.

We claim:
1. A system comprising:
a frame comprising:
   a base structure configured to locate a display that defines a front face of a mobile computing device; and
   a lateral frame structure:
      extending along and adjacent a first edge of the display;
      supported on a first side of the base structure;
      cooperating with the base structure to define a channel:
         arranged behind the display; and
         extending longitudinally between the lateral frame structure and the first side of the base structure; and
      comprising a front edge, adjacent the display, configured to preferentially deflect toward the first side of the base structure responsive to side inputs applied to a first side of the mobile computing device, the first side of the mobile computing device adjacent the first edge of the display;
a series of bridges:
   extending across the channel from the first side of the base structure to the lateral frame structure;
   longitudinally offset along the channel; and
   configured to locate a rear edge of the lateral frame structure on the base structure;
a sensor module arranged in the channel and comprising:
   a substrate; and
   an array of sensors arranged on the substrate and configured to output sense signals representing local deflections of the lateral frame structure; and
a controller configured to detect locations and force magnitudes of side inputs on the mobile computing device, proximal the first edge of the display, based on sense signals output by the array of sensors.
2. The system of claim 1:
wherein the base structure, the lateral frame structure, and the series of bridges comprise a unitary metallic structure; and
wherein a base of the channel, opposite the display, is perforated to form the series of bridges.
3. The system of claim 1, wherein each sensor, in the array of sensors:
is longitudinally centered between a pair of adjacent bridges, in the series of bridges, in the channel; and
is configured to output a sense signal representing local deflection of a section of the lateral frame structure between the pair of adjacent bridges.
4. The system of claim 1:
wherein each sensor, in the array of sensors:
   faces a section of the lateral frame structure; and
   is configured to output a sense signal representing local deflection of the section of the lateral frame structure; and wherein the controller is configured to, during a scan cycle:
read a set of sense signals from the array of sensors;
interpret a set of forces applied to sections of the lateral frame structure during the scan cycle based on the set of sense signals;
interpolate a particular position of a side input, applied on the mobile computing device proximal the first edge of the display during the scan cycle, based on the set of forces;
estimate a total force magnitude of the side input based on a combination of the set of forces; and
output the particular position and the force magnitude.

5. The system of claim 1:
wherein the channel and the array of sensors extend longitudinally over lengths greater than 80% of a longitudinal length of the first side of the mobile computing device; and
wherein the controller is configured to detect locations and force magnitudes of side inputs, within a row of discrete regions on the first side of mobile computing device, based on sense signals output by the array of sensors, each discrete region in the row of discrete regions on the first side of mobile computing device defining a longitudinal length less than 10% of the longitudinal length of the first side of the mobile computing device.

6. The system of claim 1:
wherein the sensor module further comprises a force-sensitive layer:
facing the substrate; and
exhibiting local changes in contact resistance responsive to local compression against the sensor module;
wherein each sensor in the array of sensors:
comprises a drive and sense electrode pair facing a region of the force-sensitive layer; and
is configured to output a sense signal representing contact resistance of the region of the force-sensitive layer between the drive and sense electrode pair; and
further comprising a compression element:
arranged in the channel;
filling a gap between the sensor module and the channel; and
cooperating with the base structure and the lateral frame structure to communicate local forces of side inputs, on the mobile computing device proximal the first edge of the display, into the force-sensitive layer to locally compress regions of the force-sensitive layer against the sensor module.

7. The system of claim 6, wherein the controller:
stores a set of baseline signal values representing contact resistance between the array of sensors and the force-sensitive layer during absence of side inputs on the mobile computing device; and
is configured to, during a scan cycle:
read a set of sense signals from the array of sensors;
calculate a set of corrected sense signals based on the set of sense signals and the set of baseline signal values;
interpret a set of nominal forces applied to sections of the lateral frame structure during the scan cycle based on the set of corrected sense signals; and
estimate a total force magnitude of a side input on the mobile computing device, proximal the first edge of the display during the scan cycle, based on a combination of the set of corrected forces.

8. The system of claim 1:
wherein the sensor module further comprises a force-sensitive layer:
facing the substrate; and
exhibiting local changes in contact resistance responsive to local compression against the sensor module;
wherein each sensor in the array of sensors:
comprises a drive and sense electrode pair facing a region of the force-sensitive layer; and
is configured to output a sense signal representing contact resistance of the region of the force-sensitive layer between the drive and sense electrode pair;
wherein the channel extends rearward from the display; and
wherein the front edge of the lateral frame structure, adjacent the display, is configured to preferentially deflect inwardly toward the first side of the base structure and compress the force-sensitive layer against the sensor module responsive to forces applied to the first side of the mobile computing device adjacent the first edge of the display.

9. The system of claim 8:
wherein the front edge of the lateral frame structure is configured to locally deflect inwardly toward the first side of the base structure by a distance between 0.0005 inch and 0.002 inch per pound of force applied to a local section of the side of the mobile computing device; and
wherein the force-sensitive layer exhibits local changes in contact resistance inversely proportional to local inward deflection of the front edge of the lateral frame structure.

10. The system of claim 8:
wherein the lateral frame structure defines a bore extending laterally between the first side of the mobile computing device and the channel;
further comprising a physical button element arranged in the bore, accessible from the first side of the mobile computing device, and configured to selectively compress a particular region of the force-sensitive layer adjacent a particular sensor in the array of sensors; and
wherein the controller is configured to:
detect locations and force magnitudes of side inputs on the mobile computing device, proximal the first edge of the display and offset from the physical button element, based on sense signals output by a first subset of sensors in the array of sensors; and
detect force magnitudes of inputs on the physical button element based on sense signals output by the particular sensor.

11. The system of claim 1:
wherein the first side of the base structure and an inner face of the lateral frame structure, opposing first side of the base structure, define the channel;
wherein the sensor module is arranged within the channel along the first side of the base structure and offset from the inner face of the lateral frame structure; and
wherein each sensor in the array of sensors is configured to:
capacitively couple to an adjacent section of the lateral frame structure; and
output a sense signal representing inward deflection of the adjacent section of the lateral frame structure.

12. The system of claim 11, wherein the controller:
stores a set of baseline capacitance values representing nominal distances between the array of sensors and adjacent sections of the lateral frame structure; and is configured to, during a scan cycle:
  read a set of sense signals from the array of sensors;
  calculate a set of corrected sense signals based on the set of sense signals and the set of baseline capacitance values;
  interpret a set of nominal forces applied to sections of the lateral frame structure during the scan cycle based on the set of corrected sense signals; and
  estimate a total force magnitude of a side input on the mobile computing device, proximal the first edge of the display during the scan cycle, based on a combination of the set of corrected forces.

13. The system of claim 11:
further comprising the display comprising:
  a planar display section that defines the front face of the mobile computing device; and
  a non-planar display section that extends around the first side of the mobile computing device and defines the first edge of the display; and
wherein the lateral frame structure extends along and behind the non-planar display section.

14. The system of claim 13:
wherein the front edge of the lateral frame structure and the non-planar display section are configured to locally deflect inwardly toward the first side of the base structure by a distance less that 0.0005 inch per pound of force applied to a local section of the side of the mobile computing device; and
wherein each sensor in the array of sensors is configured to:
  capacitively couple to an adjacent section of the lateral frame structure proportional to inward deflection of the adjacent section of the lateral frame; and
  output a sense signal representing capacitive coupling to the adjacent section of the lateral frame structure.

15. The system of claim 1:
wherein the frame further comprises a second outer frame structure:
  extending along and adjacent a second edge of the display;
  supported on a second side of the base structure; and
  cooperating with the base structure to define a second channel:
    arranged behind the display; and
    extending between the second outer frame structure and the second side of the base structure;
further comprising a second sensor module arranged in the second channel and comprising:
  a second substrate; and
  a second array of sensors arranged on the second substrate and configured to output sense signals representing local deflections of the second outer frame structure; and
wherein the controller is configured to detect locations and force magnitudes of side inputs on the mobile computing device, proximal the second edge of the display, based on sense signals output by the second array of sensors.

16. The system of claim 15, wherein the controller is configured to:
detect a first input at a first location on the first side of the mobile computing device at a first time based on a first set of sense signals read from the array of sensors during a first scan cycle;
in response to detecting the first input at the first location, trigger the display to render a first virtual button adjacent the first location during a first period of time succeeding the first scan cycle;
detect a second input at a second location on the second side of the mobile computing device at a second time based on a second set of sense signals read from the second array of sensors during a second scan cycle succeeding the first scan cycle; and
in response to detecting the second input at the second location, trigger the display to render the first virtual button adjacent the second location during a second period of time succeeding the second scan cycle.

17. The system of claim 1, wherein the controller is configured to:
detect a first input of a first force magnitude and at a first location on the first side of the mobile computing device at a first time based on a first set of sense signals read from the array of sensors during a first scan cycle;
in response to detecting the first input at the first location, trigger the display to render a first virtual button adjacent the first location during a first period of time succeeding the first scan cycle;
detect a second input of a second force magnitude and proximal the first location on the first side of the mobile computing device during the first period of time based on a second set of sense signals read from the array of sensors during a second scan cycle succeeding the first scan cycle; and
in response to detecting the second input proximal the first location and in response to the second force magnitude exceeding the first force magnitude, trigger an action affiliated with the first virtual button.

18. The system of claim 1:
further comprising a touchscreen comprising:
  the display; and
  a touch sensor arranged across the display and configured to output sense signals representing locations of touch inputs over the display; and
wherein the controller is configured to:
  read a first set of sense signals from the touch sensor during a scan cycle;
  detect a first lateral location and a first longitudinal location of a first touch input over the display during the scan cycle based on the first set of sense signals;
  read a second set of sense signals from the array of sensors in the sensor module during the scan cycle;
  interpret a first force magnitude of a side input in a first region of the first side of the mobile computing device based on the second set of sense signals; and
  in response to the first lateral location of the first touch input falling within a threshold distance of the first region of the first side of the mobile computing device, output a representation of the first side input of the first force magnitude and at the first longitudinal location on the first side of the mobile computing device during the scan cycle.

19. A system comprising:
a frame comprising:
  a base structure configured to locate a display that defines a front face of a mobile computing device; and
  a lateral frame structure:
    extending along and adjacent a first edge of the display;
    supported on a first side of the base structure;
    cooperating with the base structure to define a channel extending rearward from the display:
      arranged behind the display; and
      extending longitudinally between the lateral frame structure and the first side of the base structure; and comprising a front edge, adjacent the display, configured to preferentially deflect inwardly toward the first side of the base structure and compress the force-sensitive layer against the sensor module responsive to forces applied to a first side of the mobile computing device adjacent the first edge of the display;

a sensor module arranged in the channel and comprising:
a substrate;
a force-sensitive layer:
facing the substrate; and
exhibiting local changes in contact resistance responsive to local compression against the sensor module; and
an array of sensors arranged on the substrate and configured to output sense signals representing local deflections of the lateral frame structure, each sensor in the array of sensors:
comprising a drive and sense electrode pair facing a region of the force-sensitive layer; and
configured to output a sense signal representing contact resistance of the region of the force-sensitive layer between the drive and sense electrode pair; and
a controller configured to detect locations and force magnitudes of side inputs on the mobile computing device, proximal the first edge of the display, based on sense signals output by the array of sensors.

20. A system comprising:
a frame comprising:
a base structure configured to locate a display that defines a front face of a mobile computing device; and
a lateral frame structure:
extending along and adjacent a first edge of the display;
supported on a first side of the base structure;
cooperating with the first side of the base structure and an inner face of the lateral face structure, opposing the first side of the base structure to define a channel:
arranged behind the display; and
extending longitudinally between the lateral frame structure and the first side of the base structure; and
configured to locally deflect inwardly toward the first side of the base structure responsive to forces applied to a first side of the mobile computing device adjacent the first edge of the display;
a sensor module arranged within the channel along the first side of the base structure and offset from the inner face of the lateral frame structure, and comprising:
a substrate; and
an array of sensors arranged on the substrate and configured to output sense signals representing local deflections of the lateral frame structure, each sensor in the array of sensors configured to:
capacitively couple to an adjacent section of the lateral frame structure; and
output a sense signal representing inward deflection of the adjacent section of the lateral frame structure; and
a controller configured to detect locations and force magnitudes of side inputs on the mobile computing device, proximal the first edge of the display, based on the sense signal output by the array of sensors.

21. A system comprising:
a frame comprising:
a base structure configured to locate a display that defines a front face of a mobile computing device; and
a lateral frame structure:
extending along and adjacent a first edge of the display;
supported on a first side of the base structure; and
cooperating with the base structure to define a channel:
arranged behind the display; and
extending longitudinally between the lateral frame structure and the first side of the base structure;
a sensor module arranged in the channel and comprising:
a substrate; and
an array of sensors arranged on the substrate and configured to output sense signals representing local deflections of the lateral frame structure; and
a controller configured to:
detect a first input of a first force magnitude and at a first location on a first side of the mobile computing device at a first time based on a first set of sense signals read from the array of sensors during a first scan cycle;
in response to detecting the first input at the first location, trigger the display to render a first virtual button adjacent the first location during a first period of time succeeding the first scan cycle;
detect a second input of a second force magnitude and proximal the first location on the first side of the mobile computing device during the first period of time based on a second set of sense signals read from the array of sensors during a second scan cycle succeeding the first scan cycle; and
in response to detecting the second input proximal the first location and in response to the second force magnitude exceeding the first force magnitude, trigger an action affiliated with the first virtual button.

* * * * *